United States Patent
Yoon et al.

(10) Patent No.: US 10,490,285 B2
(45) Date of Patent: Nov. 26, 2019

(54) STORAGE DEVICE INCLUDING NONVOLATILE MEMORY DEVICE AND READ METHOD THEREOF

(71) Applicants: Sangyong Yoon, Seoul (KR); Donghun Kwak, Hwaseong-si (KR); Kitae Park, Seongnam-si (KR); Myung-Hoon Choi, Suwon-si (KR); Seung-Cheol Han, Seoul (KR)

(72) Inventors: Sangyong Yoon, Seoul (KR); Donghun Kwak, Hwaseong-si (KR); Kitae Park, Seongnam-si (KR); Myung-Hoon Choi, Suwon-si (KR); Seung-Cheol Han, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 30 days.

(21) Appl. No.: 14/692,494

(22) Filed: Apr. 21, 2015

(65) Prior Publication Data

US 2015/0332777 A1    Nov. 19, 2015

(30) Foreign Application Priority Data

May 13, 2014    (KR) .................... 10-2014-0057304

(51) Int. Cl.
| | |
|---|---|
| G11C 11/56 | (2006.01) |
| G11C 16/26 | (2006.01) |
| G11C 16/04 | (2006.01) |
| G06F 11/10 | (2006.01) |
| G11C 29/52 | (2006.01) |
| G11C 13/00 | (2006.01) |

(52) U.S. Cl.
CPC .......... *G11C 16/26* (2013.01); *G06F 11/1068* (2013.01); *G06F 11/1072* (2013.01); *G11C 11/5642* (2013.01); *G11C 16/0466* (2013.01); *G11C 16/0483* (2013.01); *G11C 29/52* (2013.01); *G11C 2013/0057* (2013.01)

(58) Field of Classification Search
CPC ............. G06F 11/1076; G06F 11/1008; H05K 999/99; G11C 2029/0411; G06F 11/106
USPC ........................................................ 714/764
See application file for complete search history.

(56) References Cited

U.S. PATENT DOCUMENTS

| | | | |
|---|---|---|---|
| 7,257,025 B2 | 8/2007 | Maayan et al. | |
| 7,679,133 B2 | 3/2010 | Son et al. | |
| 7,716,538 B2 | 5/2010 | Gonzalez et al. | |
| 7,876,621 B2 | 1/2011 | Sharon et al. | |

(Continued)

FOREIGN PATENT DOCUMENTS

| | | |
|---|---|---|
| JP | 2007-207343 A | 8/2007 |
| JP | 2012-203957 A | 10/2012 |
| KR | 10-2011-0078727 A | 7/2011 |

*Primary Examiner* — Samir W Rizk
*Assistant Examiner* — Enam Ahmed
(74) *Attorney, Agent, or Firm* — Volentine, Whitt & Francos, PLLC

(57) ABSTRACT

A read method of a nonvolatile memory device includes reading data from a selected memory area of the nonvolatile memory device according to a first read voltage; detecting and correcting an error of the read data; and deciding a second read voltage for reading the selected memory area when an error of the read data is uncorrectable. The second read voltage is decided according to either the number of logical 0s or 1s included in the read data, or a ratio of logical 1s to logical 0s in the read data.

16 Claims, 19 Drawing Sheets

(56) References Cited

U.S. PATENT DOCUMENTS

| | | | |
|---|---|---|---|
| 7,889,563 B2 | 2/2011 | Cho et al. | |
| 7,941,590 B2 | 5/2011 | Yang et al. | |
| 7,954,037 B2 | 5/2011 | Lasser et al. | |
| 8,014,207 B2 | 9/2011 | Ryu et al. | |
| 8,078,940 B2* | 12/2011 | Uchikawa | G06F 11/1068 365/185.24 |
| 8,355,285 B2 | 1/2013 | Huang et al. | |
| 8,365,039 B2* | 1/2013 | Man | G06F 11/1072 365/185.03 |
| 8,374,034 B2 | 2/2013 | Park | |
| 8,406,048 B2 | 3/2013 | Yang et al. | |
| 8,515,183 B2 | 8/2013 | Eun et al. | |
| 8,553,466 B2 | 10/2013 | Han et al. | |
| 8,607,128 B2* | 12/2013 | Weingarten | H03M 13/6502 714/758 |
| 8,654,587 B2 | 2/2014 | Yoon et al. | |
| 8,689,082 B2* | 4/2014 | Oh | G11C 11/5628 714/773 |
| 9,928,920 B2* | 3/2018 | Kurosawa | G11C 16/3404 |
| 2008/0239851 A1* | 10/2008 | Lin | G11C 16/3418 365/222 |
| 2009/0097313 A1* | 4/2009 | Park | G11C 11/5628 365/185.03 |
| 2009/0172481 A1* | 7/2009 | Cornwell | G06F 11/1068 714/721 |
| 2011/0233648 A1 | 9/2011 | Seol et al. | |
| 2012/0084490 A1 | 4/2012 | Choi et al. | |
| 2012/0106249 A1* | 5/2012 | Roohparvar | G06F 11/1072 365/185.03 |
| 2012/0170378 A1 | 7/2012 | Aritome et al. | |
| 2013/0080858 A1 | 3/2013 | Lee et al. | |
| 2013/0148436 A1 | 6/2013 | Kurosawa | |
| 2013/0151753 A1* | 6/2013 | Jeon | G11C 11/5642 711/103 |
| 2013/0185609 A1 | 7/2013 | Park et al. | |
| 2013/0194883 A1 | 8/2013 | Lee | |
| 2013/0198589 A1 | 8/2013 | Choi et al. | |
| 2013/0297986 A1* | 11/2013 | Cohen | G11C 29/52 714/763 |
| 2014/0029336 A1* | 1/2014 | Venkitachalam | G11C 16/0483 365/185.03 |
| 2014/0119124 A1* | 5/2014 | Kim | G11C 11/5642 365/185.18 |
| 2014/0153338 A1* | 6/2014 | Byeon | G11C 16/0483 365/185.21 |
| 2014/0258796 A1* | 9/2014 | Ghaly | G01R 31/3171 714/708 |
| 2014/0281808 A1* | 9/2014 | Lam | G06F 11/1048 714/764 |
| 2015/0155046 A1* | 6/2015 | Lee | G11C 16/10 365/185.12 |
| 2015/0212883 A1* | 7/2015 | Chen | G11C 11/5628 714/764 |
| 2015/0242270 A1* | 8/2015 | D-Abreu | G06F 11/1048 714/764 |
| 2015/0261604 A1* | 9/2015 | Sugiyama | G11C 29/52 714/764 |

\* cited by examiner

| Increment of logic '1' | ΔV |
|---|---|
| −5~−1 | +α |
| 0 | 0 |
| 1~5 | −α |
| 6~10 | −β |
| 11~20 | −γ |
| ⋮ | ⋮ |
| ~500 | −ω |

$(\alpha < \beta < \gamma < \omega)$

FIG. 22

| Difference number of '1' and '0' or Difference of number '1' between reference | ΔV |
|---|---|
| −5~−1 | +α |
| 0~4 | 0 |
| 5~9 | −α |
| 10~19 | −β |
| 20~29 | −γ |
| ⋮ | ⋮ |
| 500~ | −ω |

($\alpha < \beta < \gamma < \omega$)

FIG. 23

| Ratio of number of '0' over total page data | ΔV |
|---|---|
| $\frac{11}{20} \leq RZ < \frac{12}{20}$ | +β |
| $\frac{10}{20} \leq RZ < \frac{11}{20}$ | +α |
| $\frac{9}{20} \leq RZ < \frac{10}{20}$ | 0 |
| $\frac{8}{20} \leq RZ < \frac{9}{20}$ | −α |
| $\frac{7}{20} \leq RZ < \frac{8}{20}$ | −β |
| ⋮ | ⋮ |
| $RZ \leq \frac{5}{20}$ | −ω |

($\alpha < \beta < \gamma < \omega$)

STORAGE DEVICE INCLUDING NONVOLATILE MEMORY DEVICE AND READ METHOD THEREOF

CROSS-REFERENCE TO RELATED APPLICATIONS

A claim for priority under 35 U.S.C. § 119 is made to Korean Patent Application No. 10-2014-0057304 filed May 13, 2014, in the Korean Intellectual Property Office, the entire contents of which are hereby incorporated by reference.

BACKGROUND

The inventive concepts described herein relate to a semiconductor memory device, and more particularly, to a storage device including a nonvolatile memory device and a read method thereof.

Semiconductor memory devices may be characterized as volatile or nonvolatile. Although volatile semiconductor memory devices may perform read and write operations at high speed, content stored within volatile semiconductor memory devices may be lost at a power-off condition. In contrast, nonvolatile semiconductor memory devices are characterized by the retention of stored content regardless of whether or not they are powered.

Flash memory devices are an example of typical nonvolatile semiconductor memory devices. Flash memory devices may be widely used as voice and image data storing mediums of information appliances such as computers, cellular phones, PDAs, digital cameras, camcorders, voice recorders, MP3 players, handheld PCs, game machines, facsimiles, scanners, printers, and the like.

As the demand for mass storage devices increases, multi-level cells (MLCs) or multi-bit memory devices which store multiple bits per cell are becoming widely used. However, in memory devices employing multi-level cells, the threshold voltages of the memory cells may be identified as any of a plurality of states within a restricted voltage window. The threshold voltage of memory cells typically will vary with characteristics of the memory device, the lapse of time, and/or peripheral temperature. As a result, read voltages for identifying data states of the multi-level cells need to be adjusted to improve data integrity.

SUMMARY

Example embodiments of the inventive concept provide a read method of a nonvolatile memory device that includes reading data from a selected memory area of the nonvolatile memory device according to a first read voltage, and detecting an error in the read data. The read method further includes correcting an error in the read data when the error is correctable, and deciding a second read voltage for reading the data from the selected memory area when the detected error is uncorrectable. The second read voltage is decided according to either a number of logical 0s or 1s included in the read data, or a ratio of logical 1s to logical 0s in the read data.

Example embodiments of the inventive concept provide a storage device that includes a nonvolatile memory device configured to read data from selected memory cells using a first read voltage in response to a read command. The storage device further includes a memory controller configured to decide a second read voltage for reading data from the selected memory cells when an error in the read data is uncorrectable. The second read voltage is decided according to either a number of logical 0s or 1s included in the read data, or a ratio of logical 1s to logical 0s in the read data.

Example embodiments of the inventive concept provide a read method of a nonvolatile memory device that includes sensing data in a selected memory area of the nonvolatile memory device using at least one or more read voltages, the sensed data being latched by a page unit. The read method further includes backing up a page of the latched data, and combining the latched data by page unit, the combined data being output as read data corresponding to a page unit. The read method further includes requesting the backed-up page of data from the nonvolatile memory device when the read data is uncorrectable, outputting the backed-up page of data, and adjusting the at least one or more read voltages based on the output backed-up page of data, without accessing the selected memory area.

Example embodiments of the inventive concept provide a storage device that includes a nonvolatile memory device configured to sense data in a selected memory area of the nonvolatile memory device using at least one or more read voltages, latch the sensed data by page unit, combine the latched data by page unit, output the combined data as read data corresponding to a page unit, and back up or retain a page of the latched data. The storage device further includes a memory controller configured to receive the page of backed-up or retained data when the read data is uncorrectable, and decide a second read voltage for reading the data in the selected memory area based on a relative number of logical 0s or 1s included in the page of backed-up or retained data or based on a ratio of logical 1s to logical 0s in the page of backed-up or retained data.

BRIEF DESCRIPTION OF THE FIGURES

The above and other objects and features will become apparent from the detailed description that follows with reference to the accompanying figures, wherein like reference numerals refer to like parts throughout the various figures unless otherwise specified.

FIG. 22 is a table schematically illustrating a distribution valley detection table shown in FIG. 19, according to an embodiment of the inventive concept.

FIG. 23 is a table schematically illustrating a distribution valley detection table shown in FIG. 19, according to another embodiment of the inventive concept.

DETAILED DESCRIPTION

Figure 1:
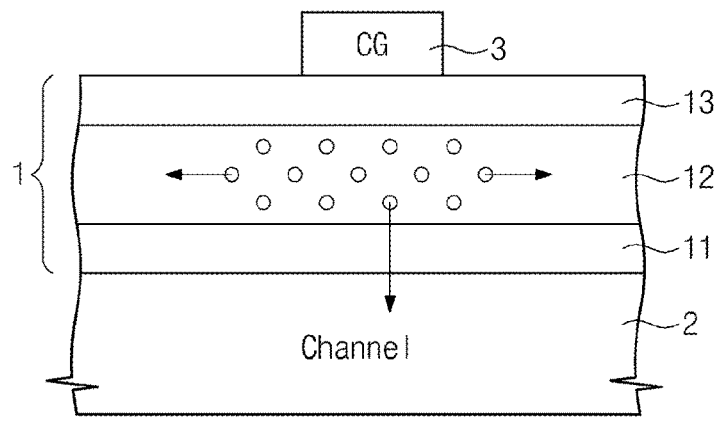
FIG. 1 is a cross-sectional view of a charge trap flash cell.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Below, features and functions of the inventive concept will be exemplarily described using a memory system including a flash memory device. Other features and merits of the inventive concept may be easily understood according to contents disclosed in this specification. The inventive concept may be implemented by different embodiments or applied thereto. Further, detailed description may be modified or changed according to viewpoints and applications without escaping from the scope, spirit, and other objects of the inventive concept.

In this specification, the terms "single-level cell (SLC) reading" and "multi-level cell (MLC) reading" may be used to represent a manner of outputting a page of data. That is, the SLC reading may mean an operation of outputting data, sensed from selected memory cells using a read voltage, without modification/change. The MLC reading may mean an operation of outputting a page of data obtained by mixing (or, cooking) data sensed using at least two read voltages.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

FIG. 1 is a cross-sectional view of a charge trap flash cell. Referring to FIG. 1, a charge trap flash cell (hereinafter, referred to as a CTF cell) includes an information storage layer 1 for storing information. The information storage layer 1 includes a first oxide layer 11, a nitride layer 12 as a charge trap layer, and a second oxide layer 13 that are sequentially stacked on a channel 2. To program the CTF cell, a program voltage is applied to control gate 3 and a predetermined voltage (e.g., 0 V) is applied to channel 2. With this bias condition, an electric field may be formed in a direction from the control gate 3 to the channel 2. At this time, charge may move from the channel 2 to the charge trap layer 12. The CTF cell may thus be characterized as being programmed under the applied bias condition. To erase the CTF cell, a predetermined voltage (e.g., a voltage equal to or greater than 0 V) is applied to the control gate 3 and an erase voltage (e.g., 20 V) is applied to the channel 2. An electric field is thus formed in a direction from the bulk of the CTF cell to the control gate 3 due to the applied bias condition, and the CTF cell is erased.

In FIG. 1, the locations of charge trapped in the charge trap layer 12 through programming as shown may be exemplary. It is understood that locations of trapped charge may vary with a characteristic of a CTF cell. For example, charge trapped in the charge trap layer 12 through programming may decrease due to various phenomena such as redistribution with time, discharge into the channel 2 (as shown by the arrow extending in a vertical direction), migration through the nitride layer 12 (as shown by the arrows extending in a horizontal direction), and so on. This phenomenon may be characterized as a fast charge loss phenomenon. A threshold voltage of a CTF cell may decrease due to the fast charge loss phenomenon. In addition, the fast charge loss phenomenon may cause drooping and spreading about a distribution of threshold voltages of CTF cells.

The drooping and spreading about a distribution of threshold voltages of CTF cells may occur with time in various shapes or states. The longer a lapse time from a programmed point in time, the more the drooping and spreading of threshold voltages of CTF cells increase.

Figure 2:
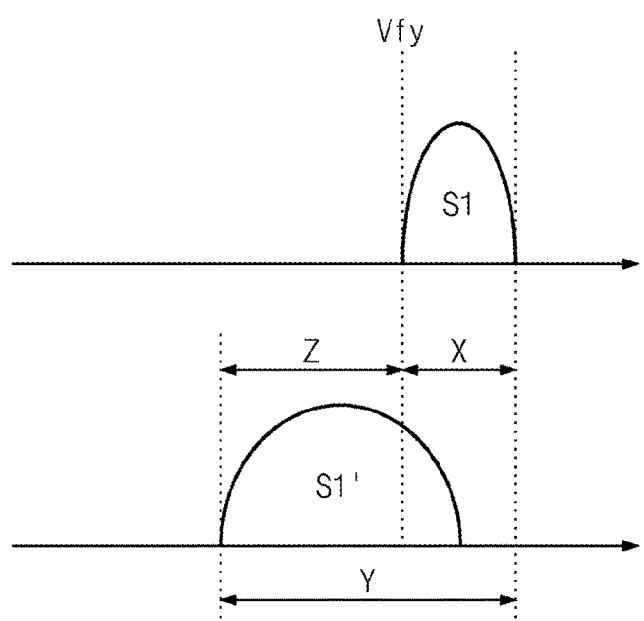
FIG. 2 is a distribution diagram schematically illustrating drooping and spreading of a threshold voltage distribution of memory cells.

FIG. 2 is a distribution diagram schematically illustrating drooping and spreading of a threshold voltage distribution of memory cells. Referring to FIG. 2, a threshold voltage distribution S1 of memory cells immediately after programming may be changed into a threshold voltage distribution S1' over time.

That is, threshold voltages of programmed CTF cells may form a threshold voltage distribution S1 immediately after a program operation is carried out. The threshold voltages of the programmed CTF cells form a threshold voltage distribution S1' after a program operation is performed and then a specific time elapses. In FIG. 2, a variation in a lower limit Vfy of a threshold voltage distribution (that is the magnitude of Z) may correspond to the drooping of the threshold voltage distribution S1', and an expanded magnitude (Y−X) of the threshold voltage distribution S1' may correspond to the spreading of the threshold voltage distribution S1'.

The drooping and spreading of the distribution may vary with time. As time elapses, the drooping and spreading may make threshold voltage distributions overlap and a location of a valley (hereinafter, referred to as a distribution valley) between overlapped distributions change. A procedure of exactly detecting the distribution valley is required to minimize errors generated from data stored in memory cells. In the inventive concept, data for detecting the distribution valley may be obtained without accessing memory cells separately.

Figure 3:
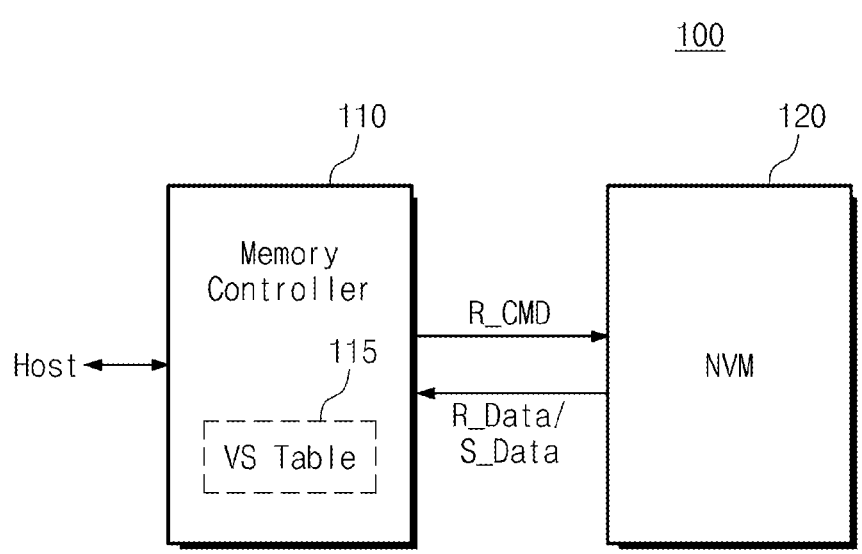
FIG. 3 is a block diagram schematically illustrating a storage device according to an embodiment of the inventive concept.

FIG. 3 is a block diagram schematically illustrating a storage device according to an embodiment of the inventive concept. Referring to FIG. 3, a storage device 100 includes a memory controller 110 and a nonvolatile memory device 120. The memory controller 110 may optimize a read voltage of a selected area at a read operation, based on data read without accessing selected memory cells separately.

The memory controller 110 may control the nonvolatile memory device 120 in response to a host request. The memory controller 110 may provide the nonvolatile memory device 120 with a write command and write data in response to a write request from the host. If a read request is issued from the host, the memory controller 110 may control the nonvolatile memory device 120 to sense and output data at a location corresponding to the read request. That is, the memory controller 110 may provide a read command R_CMD to read out selected memory cells.

In particular, the memory controller 110 uses data, which is sensed from a selected memory area of the nonvolatile memory device 120 in response to a read command R_CMD, to detect a distribution valley. That is, the nonvolatile memory device 120 senses a selected cell area in response to the read command R_CMD. The nonvolatile memory device 120 latches the sensed data and outputs it as read data R_Data. The nonvolatile memory device 120 may also perform a backup operation on data (e.g., SLC data) corresponding to at least one of a plurality of single level cell (SLC) read operations that are executed during a procedure of reading out the read data R_Data.

The memory controller 110 may perform an error detection and correction on the read data R_Data. If the read data R_Data is determined to be uncorrectable, the memory controller 110 may request the backed-up SLC data S_Data at the nonvolatile memory device 120, and based on the request, the nonvolatile memory device 120 may provide the memory controller 110 with the latched SLC data S_Data without an additional sensing operation. The memory controller 110 may estimate a shift degree of a distribution valley based on the number of logical 1s included in the SLC data or the number of logical 0s included therein.

Randomization may make it possible to constantly maintain a ratio of logical 1s to logical 0s of data stored in memory cells. A variation in the number of logical 1s or logical 0s included in the SLC data S_Data may be closely related with a shift of a distribution valley. It is possible to determine an optimal read voltage corresponding to a location of a distribution valley that is estimated based on the SLC data S_Data. The memory controller 110 includes a table 115 that is configured to map a shift degree of a distribution valley based on the relative number of logical 1s or logical 0s.

The nonvolatile memory device 120 includes one or more memory devices. Upon receiving a read command R_CMD from the memory controller 110, the nonvolatile memory device 120 reads selected memory cells using a read voltage Rn. Alternatively, when the read command R_CMD is received, the nonvolatile memory device 120 outputs SLC data S_Data, which has been backed up in a specific latch, without sensing memory cells.

According to an embodiment of the inventive concept, it is possible to provide an optimal read voltage for memory cells of the nonvolatile memory device 120 without a separate sensing operation of a selected area. In other words, performance of the memory system may be improved because a time taken to adjust a read voltage of a memory area with an uncorrectable error is minimized.

Figure 4:
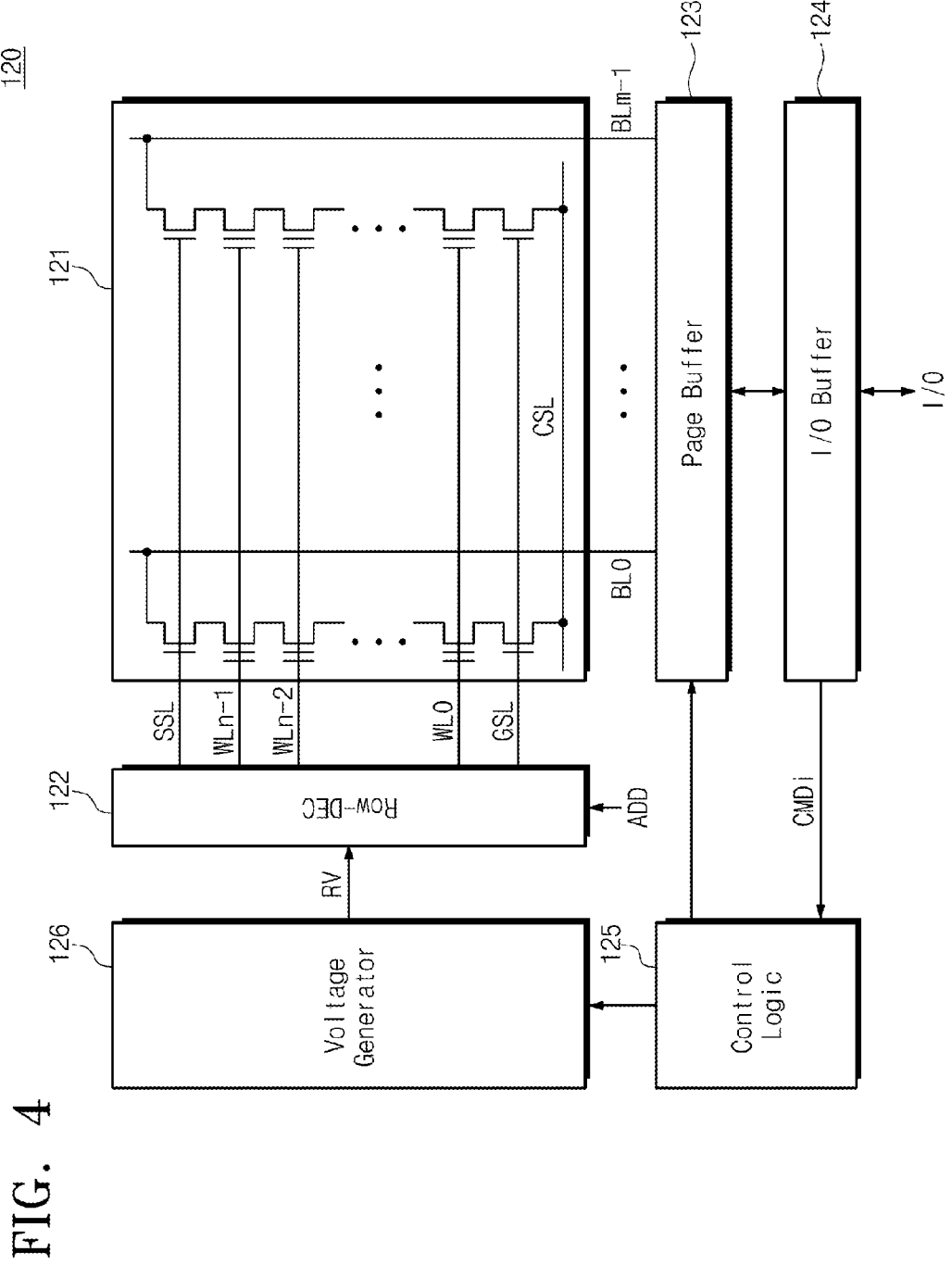
FIG. 4 is a block diagram schematically illustrating a nonvolatile memory device shown in FIG. 3.

FIG. 4 is a block diagram schematically illustrating a nonvolatile memory device shown in FIG. 3. Referring to FIG. 4, a nonvolatile memory device 120 includes a cell array 121, a row decoder 122, a page buffer 123, an input/output buffer 124, control logic 125, and a voltage generator 126.

To the row decoder 122 is connected the cell array 121 via word lines WL0 to WLn−1 and selection lines SSL and GSL. The cell array 121 is connected to the page buffer 123 via bit lines BL0 to BLm−1. The cell array 121 includes a plurality of cell strings (or, NAND cell strings). The cell strings may constitute a memory block BLK. Herein, a channel of each cell string may be formed in a vertical or horizontal direction.

During a program operation, memory cells may be selected by a predetermined unit (e.g., 2 KB (page) or 512 B) by controlling the word lines WL0 to WLn−1 and the selection lines SSL and GSL. During a read operation, memory cells may be selected by a predetermined unit (e.g., 2KB (page) or 512 B). Due to various causes, a threshold voltage distribution at a point in time when memory cells are read (read point) may be different from that at a point in time when the memory cells are programmed (program point). Thus, a read voltage may be adjusted considering a variation in a threshold voltage to improve data integrity.

The row decoder 122 may select one of memory blocks of the cell array 121 in response to an address ADD. The row decoder 122 may select one of the word lines WL0 to WLn−1 of the selected memory block. The row decoder 122 may transfer a read voltage RV provided from the voltage generator 126 to a selected word line. During a program operation, the row decoder 122 may transfer a program/verification voltage to a selected word line and a pass voltage to unselected word lines. During a read operation, the row decoder 122 may transfer a selection read voltage Vrd to a selected word line and a non-selection read voltage Vread to unselected word lines.

The page buffer 123 acts as a write driver during a program operation and as a sense amplifier during a read operation. The page buffer 123 may transfer a bit line voltage corresponding to program data to a bit line of the cell array 121 during a program operation. During a read operation, the page buffer 123 may sense data stored in a selected memory cell via a bit line. The page buffer 123 may latch the sensed data and transfer it to the input/output buffer 124.

The page buffer 123 may have a function of retaining data sensed using a specific read voltage during a read operation. When sensing MLC data, the page buffer 123 performs an SLC sensing operation twice using different read voltages. The page buffer 123 mixes a plurality of data sensed during the SLC sensing operations using the different read voltages, to configure a page. This is referred to as cooking. The page buffer 123 may output a page of read data R_Data obtained through cooking.

The page buffer 123 may back up SLC data S_Data sensed with a specific read voltage to a specific latch included therein. The page buffer 123 may provide the SLC data S_Data stored in the specific latch to the input/output buffer 124 according to a control of the control logic 125. In embodiments of the inventive concept, SLC data S_Data is stored in a specific latch of the page buffer 123. However, the inventive concept is not limited thereto. In other embodiments of the inventive concept the SLC data S_Data may be stored in a latch circuit (e.g., the input/output buffer 124) as well as in the page buffer 123, and it may be output according to a control of the control logic 125.

During a program operation, the input/output buffer 124 may provide input write data to the page buffer 123. During a read operation, the input/output buffer 124 may output read data provided from the page buffer 123 to an external device. The input/output buffer 124 may provide input addresses or commands CMDi to the row decoder 122 or the control logic 125.

The control logic 125 may control the page buffer 123 and the row decoder 122 in response to a command CMDi from the external device. When provided with a read command R_CMD from memory controller 110, the control logic 125 may control the voltage generator 126 and the page buffer 123 to sense selected memory cells. Based on a request from the memory controller 110, the control logic 125 may control the page buffer 123 and the input/output buffer 124 to output SLC data S_Data stored in the specific latch.

The voltage generator 126 generates word line voltages to be supplied to word lines and a voltage to be supplied to a bulk (e.g., a well area) at which memory cells are formed, according to a control of the control logic 125. The word line voltages to be applied to the word lines may include a program voltage, a pass voltage, selection and non-selection read voltages, and so on. During a read and a write operation, the voltage generator 126 may generate selection line voltages that are supplied to the selection lines SSL and GSL. Also, the voltage generator 126 may adjust a read voltage according to a control of the control logic 125 and may output it to the row decoder 122.

In embodiments of the inventive concept, the nonvolatile memory device 120 may sense and output data stored in a selected memory cell in response to a read command R_CMD. The nonvolatile memory device 120 may store SLC data S_Data in a specific latch while data is sensed and latched. If read data is determined as being uncorrectable, the nonvolatile memory device 120 may provide, as information for detecting a distribution valley, backed-up SLC data S_Data without an additional sensing operation at a request of the memory controller 110.

Figures 5, 6:
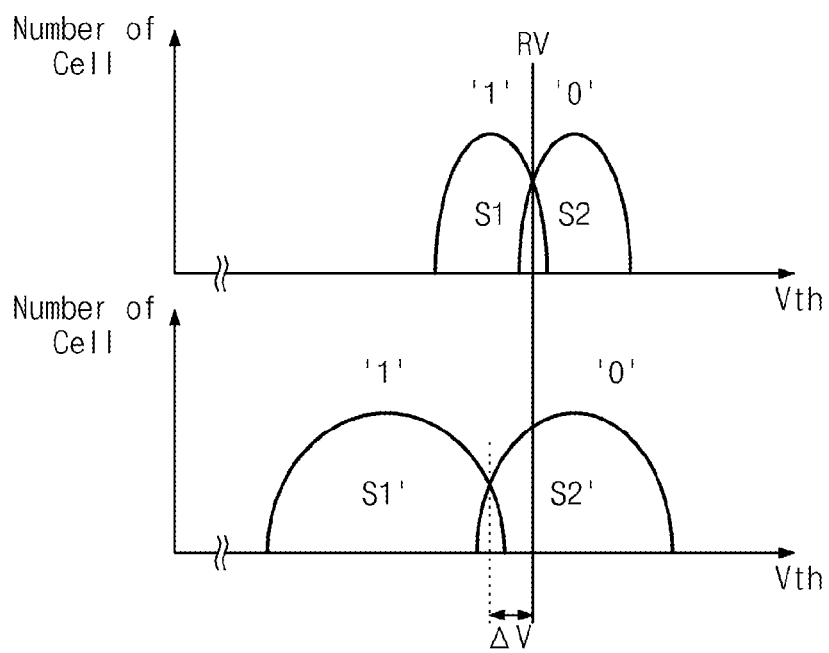
FIG. 5 shows a variation in threshold voltages of memory cells.
FIG. 6 is a diagram schematically illustrating a distribution valley detection table configured in a memory controller such as shown in FIG. 3, according to an embodiment of the inventive concept.

FIG. 5 shows a variation in threshold voltages of memory cells. Referring to FIG. 5, there are illustrated distributions S1 and S2 of threshold voltages of memory cells immediately after programming, and distributions S1' and S2' of threshold voltages of memory cells changed due to the lapse of time and a specific cause. The abscissa represents a threshold voltage Vth, and the ordinate represents the number of memory cells MC. The ordinate may represent the number of memory cells MC in log scale.

Threshold voltages of memory cells may form distributions S1 and S2 immediately after a program operation. The distributions S1 and S2 may be distinguished using a read voltage RV. The read voltage RV may be decided to have a threshold voltage level corresponding to a distribution valley at which the distributions S1 and S2 are overlapped, by analyzing various factors. However, the distributions S1 and S2 may be changed into distributions S1' and S2' when threshold voltages of memory cells are varied due to the lapse of time and various causes, thereby resulting in a shift of the distribution valley. As illustrated in FIG. 5, the distribution valley may be negatively shifted by $\Delta V$ on the basis of the read voltage RV initially decided.

In the case a sensing operation is performed with the read voltage RV, a ratio of logical 0s to logical 1s stored in memory cells may be maintained in balance at a point in time when the distributions S1 and S2 are maintained. The reason is that data is randomized such that program states are uniformly distributed. However, if the distributions S1 and S2 are changed into distributions S1' and S2' due to a variation in threshold voltages of memory cells, the balance among program states may be broken and no longer exist. For example, the number of logical 1s may increase when memory cells of which threshold voltages belong to the distributions S1' and S2' are sensed with the read voltage RV.

In accordance with embodiments of the inventive concept, the increment of logical 1 may be detected to estimate a shift degree $\Delta V$ of the distribution valley, and a new read voltage may be decided considering the estimated result. The increment or decrement of logical 1 may be detected without additional sensing and read operations. A shift degree of the distribution valley may be estimated using either data in which an error occurs or SLC data generated during a procedure of reading the data in which an error occurs. This technique may make it possible to markedly shorten a time taken to provide a read voltage for read retry when an uncorrectable error is detected.

FIG. 6 is a diagram schematically illustrating a distribution valley detection table 115 configured in memory controller 110 shown in FIG. 3, according to an embodiment of the inventive concept. Referring to FIG. 6, distribution valley detection table 115 shows a relation between increments of logical 1 and shift degrees.

A memory controller 110 performs an error detection and correction of data read from a selected memory area. In particular, if the read data is uncorrectable, the memory controller 110 requests backed-up SLC data S_Data from nonvolatile memory device 120. The SLC data S_Data may be a part of data including an uncorrectable error or data sensed during a read operation for outputting read data. Thus, the SLC data S_Data may be provided to the memory controller 110 without additionally sensing selected memory cells.

The memory controller 110 receives the SLC data S_Data to detect an increment of logical 1. For example, in a case that the number of logical 1s included in the SLC data S_Data is more than (or exceeds) a reference value Rn by as many as 1 to 5, the memory controller 110 increases an optimal read voltage corresponding to a distribution valley by $\alpha$. That is, in the case that the number of logical 1s included in the SLC data S_Data increases, the memory controller 110 determines a location of the distribution valley as being increased. The memory controller 110 may decide an optimal read voltage by increasing a read voltage by $\alpha$ corresponding to an increment of logical 1.

If the number of logical 1s is equal to the reference value Rn, the memory controller 110 selects a normal read voltage RV as an optimal read voltage corresponding to a distribution valley. That is, this may be viewed as a case wherein a location of the distribution valley is not changed. If the number of logical 1s included in the SLC data S_Data is less than the reference value Rn by as many as 1 to 5, the memory controller 110 decreases an optimal read voltage corresponding to a distribution valley by $\alpha$. If the number of logical 1s included in the SLC data S_Data is less than the reference value Rn by as many as 6 to 10, the memory controller 110 decreases an optimal read voltage corresponding to a distribution valley by $\beta$. If the number of logical 1s included in the SLC data S_Data is less than the reference value Rn by as many as 11 to 20, the memory controller 110 decreases an optimal read voltage corresponding to a distribution valley by $\gamma$. If the number of logical 1s included in the SLC data S_Data is less than the reference value Rn by as many as 500, the memory controller 110 decreases an optimal read voltage corresponding to a distribution valley by $\omega$.

The memory controller 110 decides a shift degree of a distribution valley based on an increment of logical 1 in the distribution valley detection table 115. In embodiments of the inventive concept, a shift degree of a distribution valley is determined using an increment of logical 1. However, the inventive concept is not limited thereto. For example, in other embodiments of the inventive concept, a shift degree of a distribution valley may be decided based on a variation in a ratio of logical 1s to all bits of the SLC data S_Data. An increment of logical 1 or a variation in a ratio may be used as a parameter for determining a shift degree of a distribution valley. However, a shift degree of a distribution valley may be determined using the number of logical 0s or a variation in a ratio about the number of all data bits as a parameter.

Figure 7:
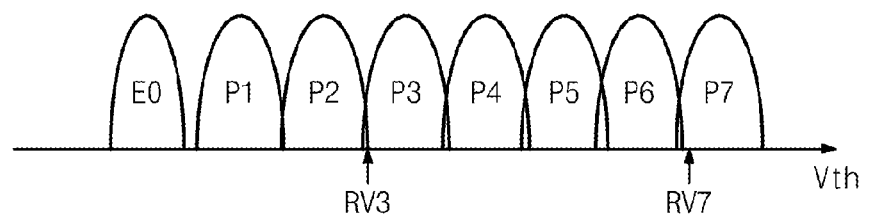
FIG. 7 is a diagram schematically illustrating a read voltage applied to a selected word line at a read operation.

FIG. 7 is a diagram schematically illustrating a read voltage applied to a selected word line during a read operation. FIG. 7 shows threshold voltage distributions of memory cells storing 3-bit MLC data (hereinafter, referred to as TLC data).

If three pages of data are programmed in a triple-level cell (TLC), a threshold voltage of a memory cell may be included in one of threshold voltage distributions corresponding to eight states. For example, the TLC may have a threshold voltage that belongs to one of an erase state E0 and seven program states P1 to P7. A threshold voltage of the TLC may vary due to various factors: the lapse of time, interference among cells, and so on. Because of the variation, the threshold voltage distributions may be overlapped to such an extent to make it difficult to exactly identify the threshold voltage distributions.

Normal read voltages RV3 and RV7 may be provided to a word line of selected memory cells to read an MSB page of the TLCs. First, memory cells are sensed using the normal read voltage RV7, and then, they are sensed using the normal read voltage RV3. The sensed data values are mixed (or combined), and the mixed result is output as MSB page data. A process of mixing SLC data sensed using a plurality of read voltages is referred to as cooking. In embodiments of the inventive concept, the normal read voltage RV7 is applied prior to the normal read voltage RV3. However, the inventive concept is not limited thereto. For example, in other embodiments of the inventive concept the normal read voltage RV3 is applied prior to the normal read voltage RV7.

In embodiments of the inventive concept, nonvolatile memory device 120 may perform cooking when MLC data is sensed and latched, and may back up SLC data sensed using one of the normal read voltages RV3 and RV7. For example, when receiving an MSB page read request of selected memory cells, the nonvolatile memory device 120 may retain a result of an SLC read operation executed during an MSB page read process or store it in a specific latch. For example, SLC data sensed using the read voltage RV7 during an MSB page read process may be retained or backed up in the specific latch included in page buffer 123 (refer to FIG. 4). The specific latch may store the retained or backed-up SLC data until read retry is requested or another page read command is received.

If an error detection result indicates that the MSB page data obtained via the cooking is uncorrectable, memory controller 110 requests the retained or backed-up SLC data from the nonvolatile memory device 120, and the nonvolatile memory device 120 provides the memory controller 110 with the latched SLC data without additionally sensing selected memory cells. The memory controller 110 may estimate a shift degree of a distribution valley according to the number of logical 1s or logical 0s, or an increase or decrease in a ratio of logical 1s to logical 0s, and decides an optimal read voltage for read retry.

In FIG. 7, the normal read voltages RV3 and RV7 for reading the MSB page of TLCs are illustrated. The merits of the inventive concept may be applied to normal read voltages for reading LSB and CSB pages.

Figure 8:
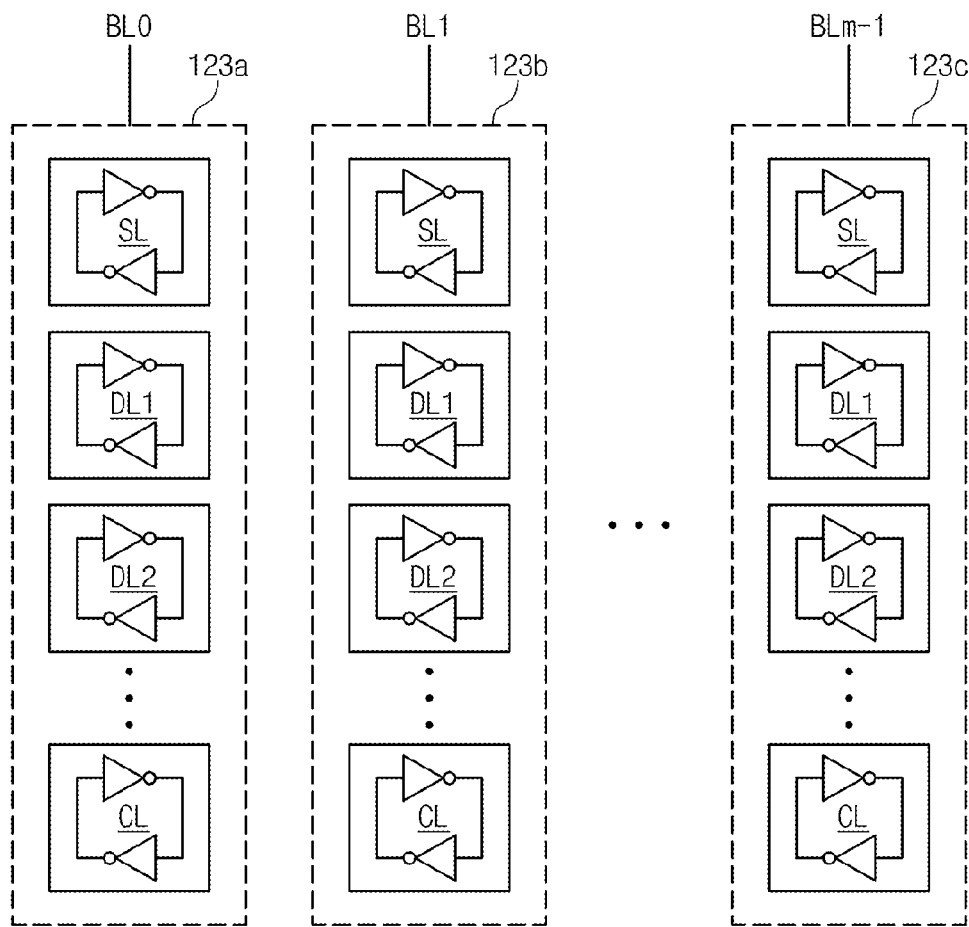
FIG. 8 is a block diagram schematically illustrating a page buffer shown in FIG. 4, according to an embodiment of the inventive concept.

FIG. 8 is a block diagram schematically illustrating page buffer 123 shown in FIG. 4, according to an embodiment of the inventive concept. Referring to FIG. 8, page buffer 123 contains a plurality of page buffer circuits 123a, 123b . . . 123c. Each page buffer circuit may include a latch for storing SLC data S_Data of the inventive concept.

In detail, each of the page buffer circuits 123a to 123c includes a sense latch SL, data latches DL1 and DL2, and a cache latch CL. Sensing and latch operations of the page buffer circuits 123a to 123c are performed in response to a read request of one of a plurality of page data stored in selected memory cells. For example, the page buffer circuits 123a to 123c may sense pre-charged voltages of bit lines BL0 to BLm−1 at a point in time when each of a plurality of normal read voltages RV3 and RV7 is provided. Data sensed by the sensing latch SL is dumped into the data latches DL1 and DL2. A sensing process about each normal read voltage is referred to as an SLC read operation. After a plurality of SLC read operations are performed, cooking is performed to read an MSB page. A page of data may be obtained through the cooking of data sensed using a plurality of read voltages.

In each of the page buffer circuits 123a to 123c, the data latches DL1 and DL2 or the sensing latch SL may retain data sensed at an SLC read operation. This operation is referred to as an SLC backup operation. SLC data S_Data kept through the SLC backup operation may be output to an external device when a specific command is received.

Figure 9:
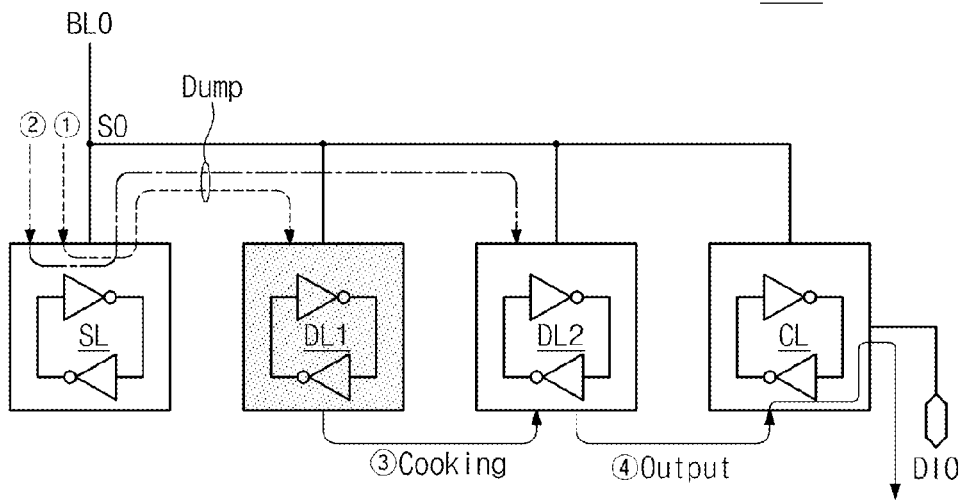
FIGS. 9 and 10 are block diagrams showing a procedure of backing SLC data up in a page buffer circuit shown in FIG. 8.
Figure 10:
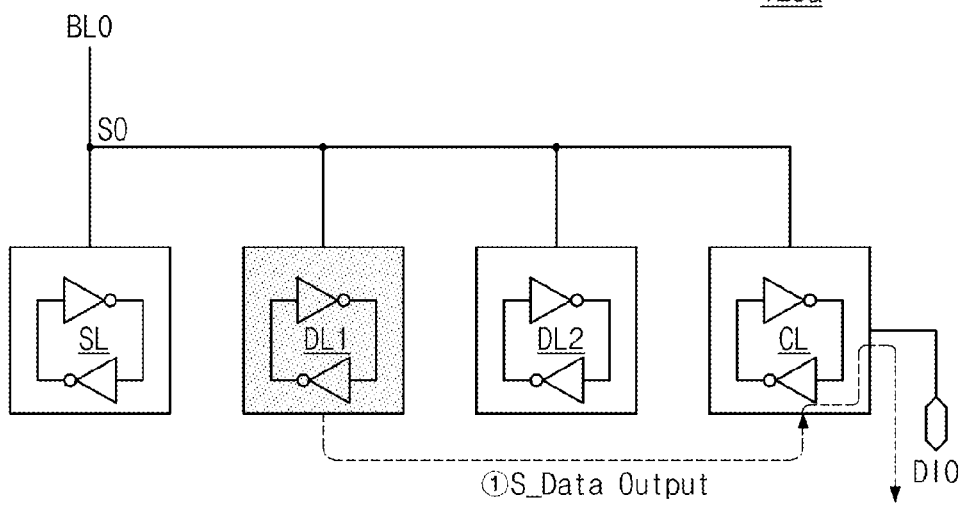

FIGS. 9 and 10 are block diagrams showing a procedure of backing up SLC data S_Data in a page buffer circuit 123a shown in FIG. 8. FIG. 9 shows a procedure of reading MLC data, according to an embodiment of the inventive concept. Although page buffer circuit 123a is with reference to FIG. 9, the other page buffer circuits 123b to 123c also back SLC data S_Data up in the same manner as described with reference to FIG. 9.

First, bit lines BL0 to BLm−1 are pre-charged for sensing. A read voltage RV7 is applied to a word line of selected memory cells according to a control of control logic 125, and a voltage at a sensing node S0 corresponding to the bit line BL0 is developed based on whether a memory cell connected to the bit line BL0 is an on cell or an off cell. A sensing latch SL stores a voltage at the sensing node S0 as sensing data. Next, data latched in the sensing latch SL is transferred to a data latch DL1. A sensing and dumping procedure that is made using the read voltage RV7 is indicated by a line (①). A read operation indicated by the line (①) corresponds to an SLC read unit.

The bit lines BL0 to BLm−1 are again pre-charged. A read voltage VR3 is then applied to the word line of the selected memory cells according to a control of the control logic 125, and a voltage at the sensing node S0 corresponding to the bit line BL0 is developed based on whether the memory cell connected to the bit line BL0 is an on cell or an off cell. The sensing latch SL stores a voltage at the sensing node S0 as sensing data. Next, data latched in the sensing latch SL is transferred to a data latch DL2. A sensing and dumping procedure that is made using the read voltage RV3 is indicated by a line (②). A read operation indicated by the line (②) corresponds to another SLC read unit.

Afterwards, data cooking may be performed to merge data sensed using the two read voltages RV3 and RV7 into a page unit. A page of data that has been actually provided from an external device may be reconfigured through the data cooking. This is indicated by a line (③). A detailed description about the data cooking is not directly related to the spirit and scope of the inventive concept, and a description thereof is thus omitted. Final data obtained via the data cooking is transferred to the external device to pass through a cache latch CL (③).

Accordingly, an SLC read operation may be performed two times to read an MSB page from 3-bit MLCs. Even though the data cooking is performed, a result of at least one of the SLC read operations may be kept in the data latch DL1. If a specific command is provided from an external device, the nonvolatile memory device 120 may dump SLC data stored in the data latch DL1 into the cache latch CL to output the SLC data to the external device.

FIG. 10 shows a procedure of outputting backed-up SLC data retained in the data latch DL1. When it is determined that MSB page data is uncorrectable, memory controller 110 (refer to FIG. 3) requests the backed-up SLC data S_Data from the nonvolatile memory device 120 and the nonvolatile memory device 120 provides the memory controller 110 with the SLC data S_Data backed up in the data latch DL1 without accessing memory cells. The memory controller 110 decides a shift degree of a distribution valley based on an increment or decrement of logical 1 or logical 0 about the SLC data S_Data thus transferred. The memory controller 110 may then issue a read retry command to the nonvolatile memory device 120 such that a read operation of selected memory cells is performed using a read voltage corresponding to the detected distribution valley. Control logic 125 may reset data latches of page buffer 123 in response to the read retry command.

In embodiments of the inventive concept, page buffer circuit 123*a* has a function of backing up at least one SLC page data during an MLC data read procedure. However, the inventive concept is not limited thereto. For example, in other embodiments of the inventive concept two SLC data latched through sensing operations performed twice may be backed up.

Figure 11:
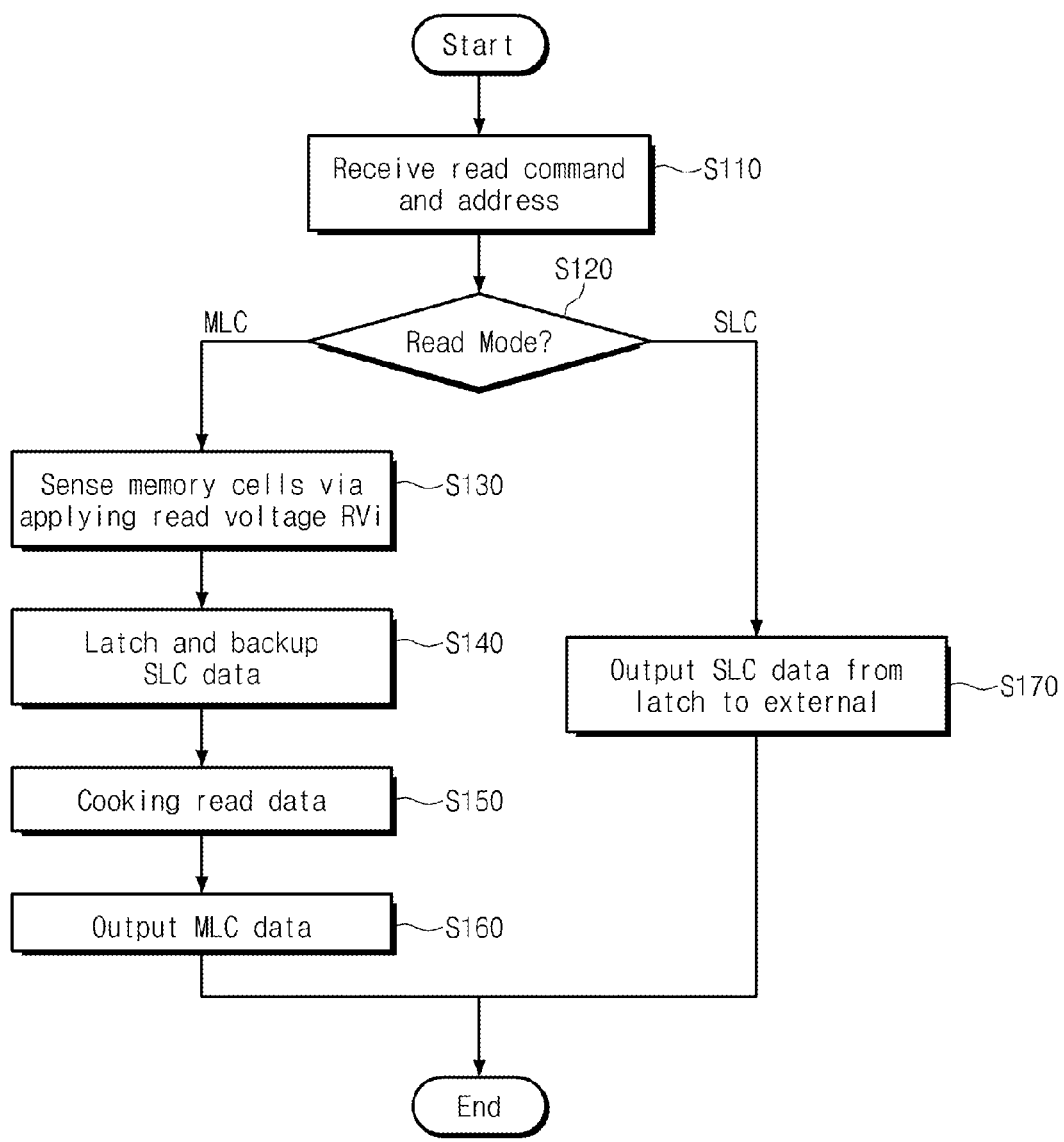
FIG. 11 is a flow chart schematically illustrating a data read method of a nonvolatile memory device according to an embodiment of the inventive concept.

FIG. 11 is a flow chart schematically illustrating a data read method of a nonvolatile memory device 120 according to an embodiment of the inventive concept. Referring to FIG. 11, nonvolatile memory device 120 may sense and output MLC data in response to a read command from an external device or a read mode, or may output backed-up SLC data without a sensing operation. Upon receiving a read command R_CMD from the external device, the nonvolatile memory device 120 may begin a read operation or output the backed-up SLC data S_Data.

In step S110, the nonvolatile memory device 120 receives a read command R_CMD and an address from a memory controller 110. The read command R_CMD may include a read mode about memory cells that are to be selected by the address.

In step S120, operation of the nonvolatile memory device 120 may diverge according to the commanded read mode. When a read mode requested by the memory controller 110 is an MLC mode, the method proceeds to step S130. When a read mode requested by the memory controller 110 is an SLC mode, the method proceeds to step S170. The SLC read mode may be a mode that is designated for the nonvolatile memory device 120 when the memory controller 110 detects an uncorrectable error.

In step S130, the nonvolatile memory device 120 senses memory cells selected by the address. That is, the nonvolatile memory device 120 may carry out a plurality of SLC read operations using a plurality of normal read voltages RVi.

In step S140, the nonvolatile memory device 120 stores data sensed using the plurality of normal read voltages RVi in data latches. Data sensed using any normal read voltage can be stored in a backup latch that is placed outside of page buffer 123.

In step S150, the nonvolatile memory device 120 may perform cooking to merge data sensed using the plurality of normal read voltages RVi into a page of data, as described with reference to FIG. 9 for example.

In step S160, a page of MLC data obtained via the cooking is dumped into cache latches CL of page buffer circuits to output the page of MLC data to an external device.

In step S170, the nonvolatile memory device 120 outputs backed-up SLC data S_Data without sensing memory cells selected by the address. That is, the nonvolatile memory device 120 may provide the memory controller 110 with one of a plurality of SLC pages that are latched or backed up using the plurality of normal read voltages RVi.

Based on a read mode provided from an external device, the nonvolatile memory device 120 of the inventive concept may output MLC data obtained by a sensing operation from memory cells, or may output backed-up SLC data S_Data obtained without a sensing operation. Herein, the backed-up SLC data S_Data may be data that is backed up during an MLC read operation performed prior to a currently input read command R_CMD. When the memory controller 110 requests SLC data S_Data for detecting a distribution valley, the nonvolatile memory device 120 skips a sensing operation that necessitates a relatively long time, and outputs SLC data that is previously stored in a data latch or a backup latch.

Figure 12:
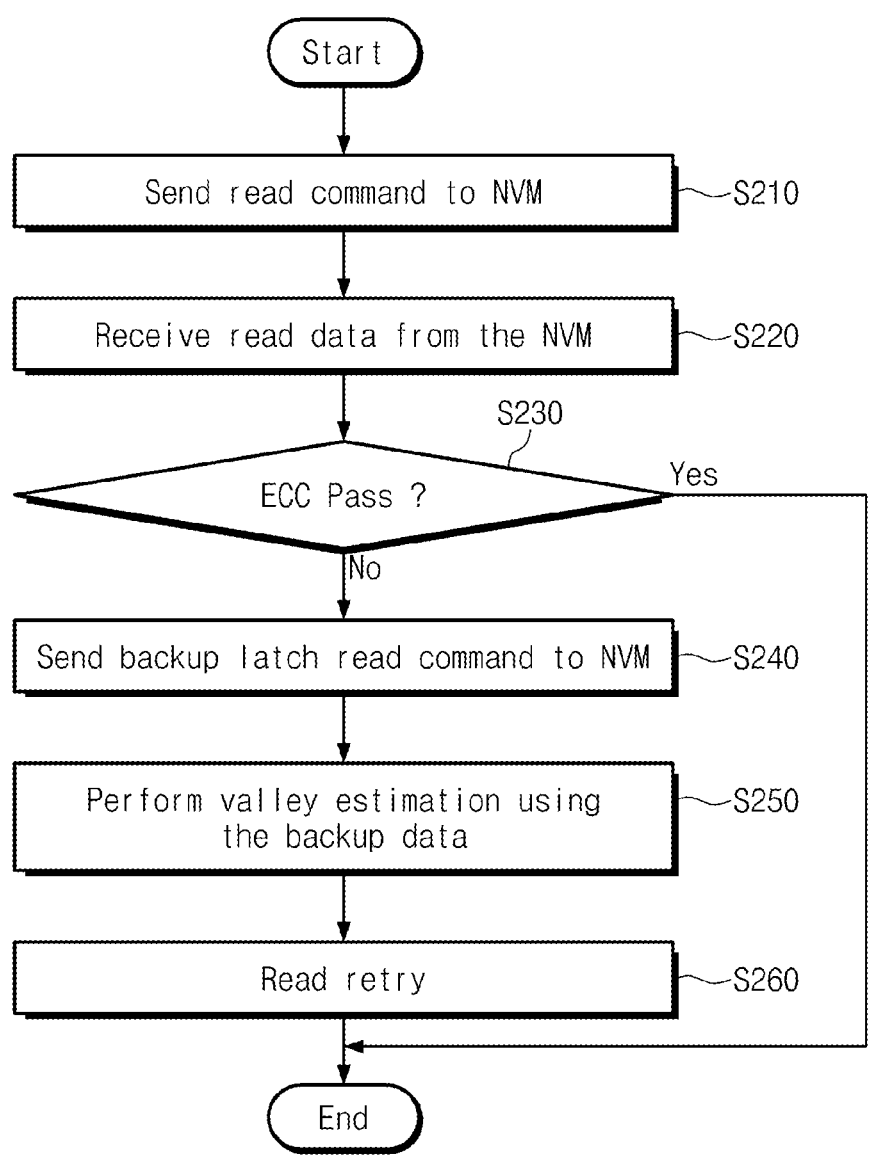
FIG. 12 is a flow chart schematically illustrating a nonvolatile memory device control method of a memory controller according to an embodiment of the inventive concept.

FIG. 12 is a flow chart schematically illustrating a nonvolatile memory device control method of memory controller 110 according to an embodiment of the inventive concept. Referring to FIG. 12, memory controller 110 may perform a variety of operations including accessing nonvolatile memory device 120 to read data stored in a selected memory area, error detection and correction, detecting a distribution valley, a read retry, and so on.

In step S210, the memory controller 110 issues a read command R_CMD to the nonvolatile memory device 120. At this time, a read mode designated by the read command R_CMD may be an MLC read mode. The nonvolatile memory device 120 senses selected memory cells to output MLC data.

In step S220, the memory controller 110 receives MLC data from the nonvolatile memory device 120. In the following description of FIG. 12, it is assumed that the received MLC data is a page of data.

In step S230, the memory controller 110 may perform error detection and correction on the received MLC data. If the received MLC data is not erroneous or is correctable (Yes), a read operation of the selected memory area may end. If the received MLC data is uncorrectable (No), the method proceeds to step S240.

In step S240, the memory controller 110 requests SLC data for detecting a distribution valley from the nonvolatile memory device 120. For example, the memory controller 110 issues a command to the nonvolatile memory device 120 such that the nonvolatile memory device 120 outputs backed-up SLC data.

In step S250, the memory controller 110 may perform an operation of detecting a distribution valley. That is, the memory controller 110 detects an increment or decrement of logical 1 or logical 0 about the SLC data S_Data from the nonvolatile memory device 120. The memory controller 110 estimates a shift degree of a distribution valley according to the detected increment or decrement, and adjusts a read voltage based on the estimated result.

In step S260, the memory controller 110 issues a read retry command to the nonvolatile memory device 120 such that the nonvolatile memory device 120 senses the selected memory cells with the adjusted read voltage and outputs the sensed data.

According to embodiments of the inventive concept, even though an uncorrectable error occurs, a distribution valley may be detected without additionally accessing memory cells. It is thus possible to minimize lowering of read speed of the nonvolatile memory device 120, even in the case that errors are frequently detected.

Figure 13:
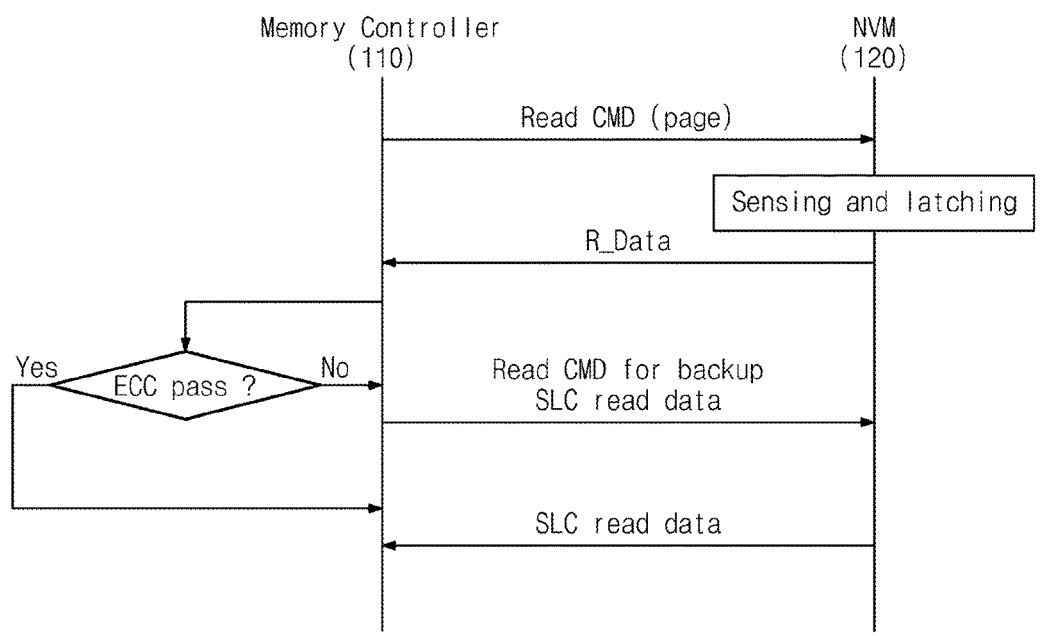
FIG. 13 is a diagram schematically illustrating an operation of a storage device according to an embodiment of the inventive concept.

FIG. 13 is a diagram schematically illustrating an operation of a storage device according to an embodiment of the inventive concept. FIG. 13 schematically shows interaction between memory controller 110 and nonvolatile memory device 120.

First, the memory controller 110 issues a read command R_CMD to the nonvolatile memory device 120. Herein, the read command R_CMD corresponds to one of a plurality of page data stored in selected memory cells. That is, the read command R_CMD may include read-mode (MLC-mode) information.

The nonvolatile memory device 120 performs a read operation of selected memory cells in response to the read command R_CMD. That is, the nonvolatile memory device 120 performs an MLC read operation of the selected memory cells. Herein, the nonvolatile memory device 120 may perform an SLC read operation of the selected memory cells, and resultant data of the SLC read operation may be backed up. The nonvolatile memory device 120 may perform cooking of data which is latched according to SLC read operations performed at least twice, to merge data into a page. The merged data may be transferred to the memory controller 110 as read data R_Data.

The memory controller 110 performs an error detection and correction of the read data R_Data. If an error is not detected or is correctable, a read operation of the selected memory cells may end (Yes). In contrast, if the read data R_Data is uncorrectable (No), the memory controller 110 requests backed-up SLC data from the nonvolatile memory device 120.

In response to a request from the memory controller 110, the nonvolatile memory device 120 provides the memory controller 110 with SLC data S_Data previously backed up in a latch without sensing memory cells. The memory controller 110 decides a shift degree of a distribution valley based on an increment or decrement of logical 1 about the received SLC data S_Data, or a ratio of logical 1s to logical 0s thereof. Although not shown in FIG. 13, the memory controller 110 may estimate a location of a distribution valley and perform a read retry operation of the nonvolatile memory device 120 based on an estimated result.

Accordingly, the nonvolatile memory device 120 backs up SLC data S_Data sensed via a read operation in a page buffer 123 or a separate latch during a normal read operation. Also, the memory controller 110 estimates a location of a distribution valley using the backed-up SLC data S_Data, and adjusts a read voltage. Interaction between the memory controller 110 and the nonvolatile memory device 120 may thus enable data read speed to be improved.

Figure 14:
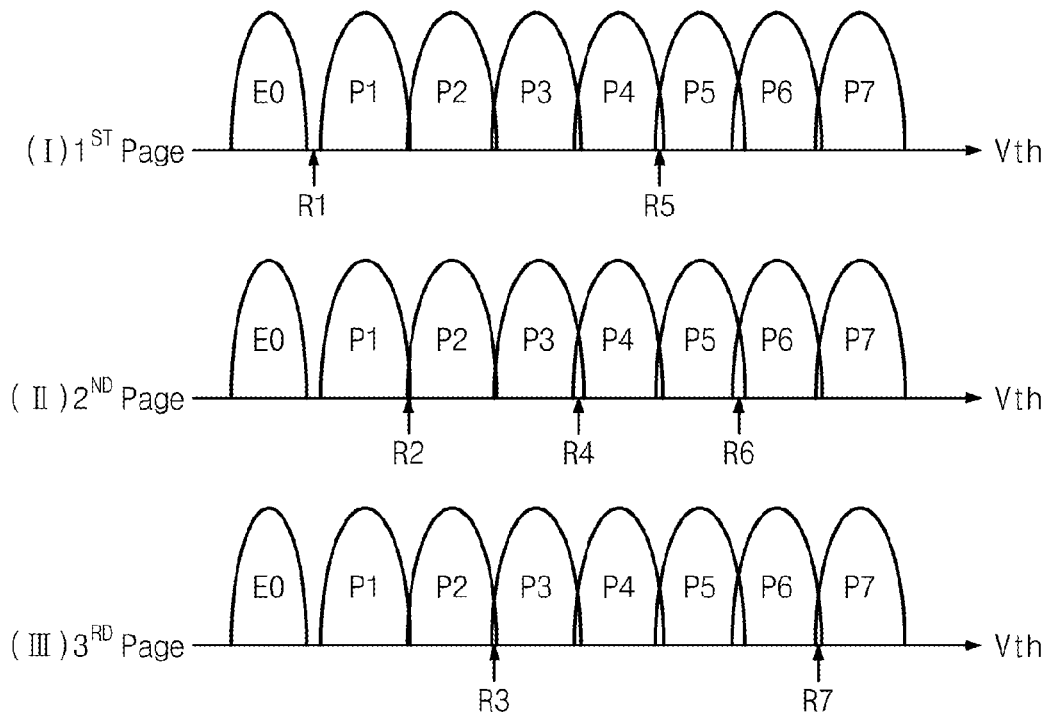
FIG. 14 is a diagram for describing embodiments of the inventive concept.

FIG. 14 is a diagram for describing embodiments of the inventive concept. Referring to FIG. 14, there are illustrated normal read voltages of a nonvolatile memory device 120 that includes memory cells storing 3-bit data (hereinafter, referred to as TLC).

Read voltages R1 and R5 are applied to a word line of selected memory cells to read a first page corresponding to an LSB page. Read voltages R2, R4, and R6 are applied to the word line of the selected memory cells to read a second page corresponding to a CSB page. Read voltages R3 and R7 are applied to the word line of the selected memory cells to read a third page corresponding to an MSB page.

The nonvolatile memory device 120 retains results of SLC read operations in which the selected memory cells are read using a plurality of read voltages. That is, when receiving a read command R_CMD for the second page, the nonvolatile memory device 120 performs SLC read operations using the read voltages R2, R4, and R6, respectively. At least one of the results of the SLC read operations, that is at least one SLC data may be backed up in a latch. While at least one SLC data is backed up, read-requested MLC data is configured via cooking and the configured data is output to an external device. A backup operation of the SLC data may be applied to a read operation of the LSB page in the same manner.

Figure 15:
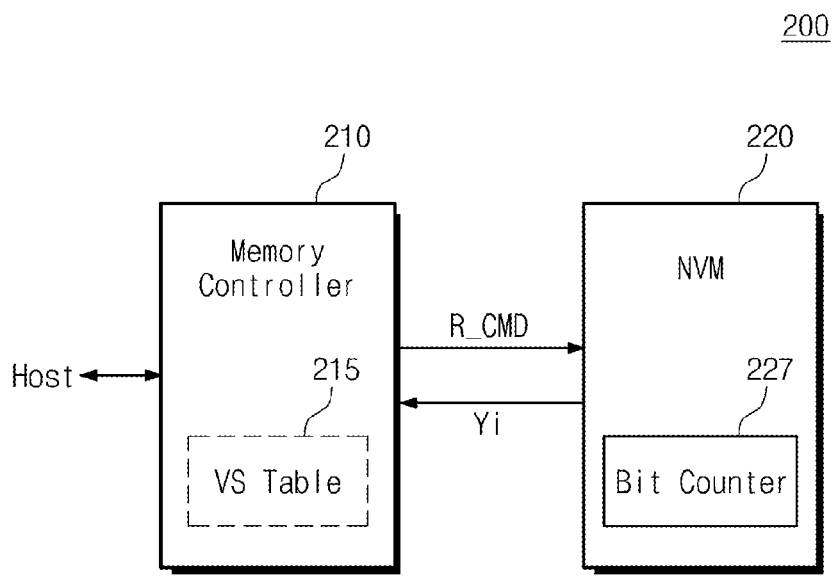
FIG. 15 is a block diagram schematically illustrating a storage device according to another embodiment of the inventive concept.

FIG. 15 is a block diagram schematically illustrating a storage device 200 according to another embodiment of the inventive concept. Referring to FIG. 15, nonvolatile memory device 220 may back up SLC data S_Data accompanying an MLC read operation. The nonvolatile memory device 220 provides a memory controller 210 with information Yi about the number of logical 1s included in the backed-up SLC data S_Data according to a request of the memory controller 210.

The memory controller 210 may issue a read command R_CMD to the nonvolatile memory device 220. The memory controller 210 may perform an error detection and correction of data R_Data read from a selected memory area. If an uncorrectable error is detected, the memory controller 210 requests the number of off or on cells included in SLC data from the nonvolatile memory device 220. That is, the memory controller 210 requests the number of logical 1s or 0s included in the backed-up SLC data from the nonvolatile memory device 220. The memory controller 210 decides an optimal read voltage by estimating a shift degree of a distribution valley based on a bit count Yi from the nonvolatile memory device 220.

The nonvolatile memory device 220 senses a selected cell area in response to a read command R_CMD from the memory controller 210. The nonvolatile memory device 220 latches the sensed data and outputs the latched data as read data R_Data. Also, the nonvolatile memory device 220 may back up at least one of a plurality of SLC data obtained while the read data R_Data is read. If the memory controller 210 requests the backed-up SLC data S_Data, the nonvolatile memory device 220 counts the number of logical 1s or 0s included in the backed-up SLC data S_Data. The nonvolatile memory device 220 may include a bit counter 227 that counts the number of logical 1s or 0s included in SLC data S_Data.

If an uncorrectable error is detected, the memory controller 210 requests the number of logical 1s or 0s included in backed-up SLC data S_Data from the nonvolatile memory device 220. in the following description, the number of logical 1s or 0s included in the backed-up SLC data S_Data may be referred to as a bit count. In response to such a request, the nonvolatile memory device 220 counts the number of logical 1s or 0s included in the backed-up SLC data S_Data without an additional sensing operation. The number of logical 1s or 0s included in the backed-up SLC data S_Data, that is a bit count Yi, may be used to estimate a variation in a distribution valley by the memory controller 210. The memory controller 210 estimates a location of a distribution valley and decides an optimal read voltage corresponding to the estimated location. The memory controller 210 may include a table 215 which is configured to decide a shift degree of a distribution valley based on a relative magnitude of logical 0 or logical 1.

In embodiments of the inventive concept, an optimal read voltage for memory cells of the nonvolatile memory device 220 may be provided without additionally sensing a selected area, thereby making it possible to minimize a time taken to decide a read voltage. That is, performance of a memory system may be improved.

Figure 16:
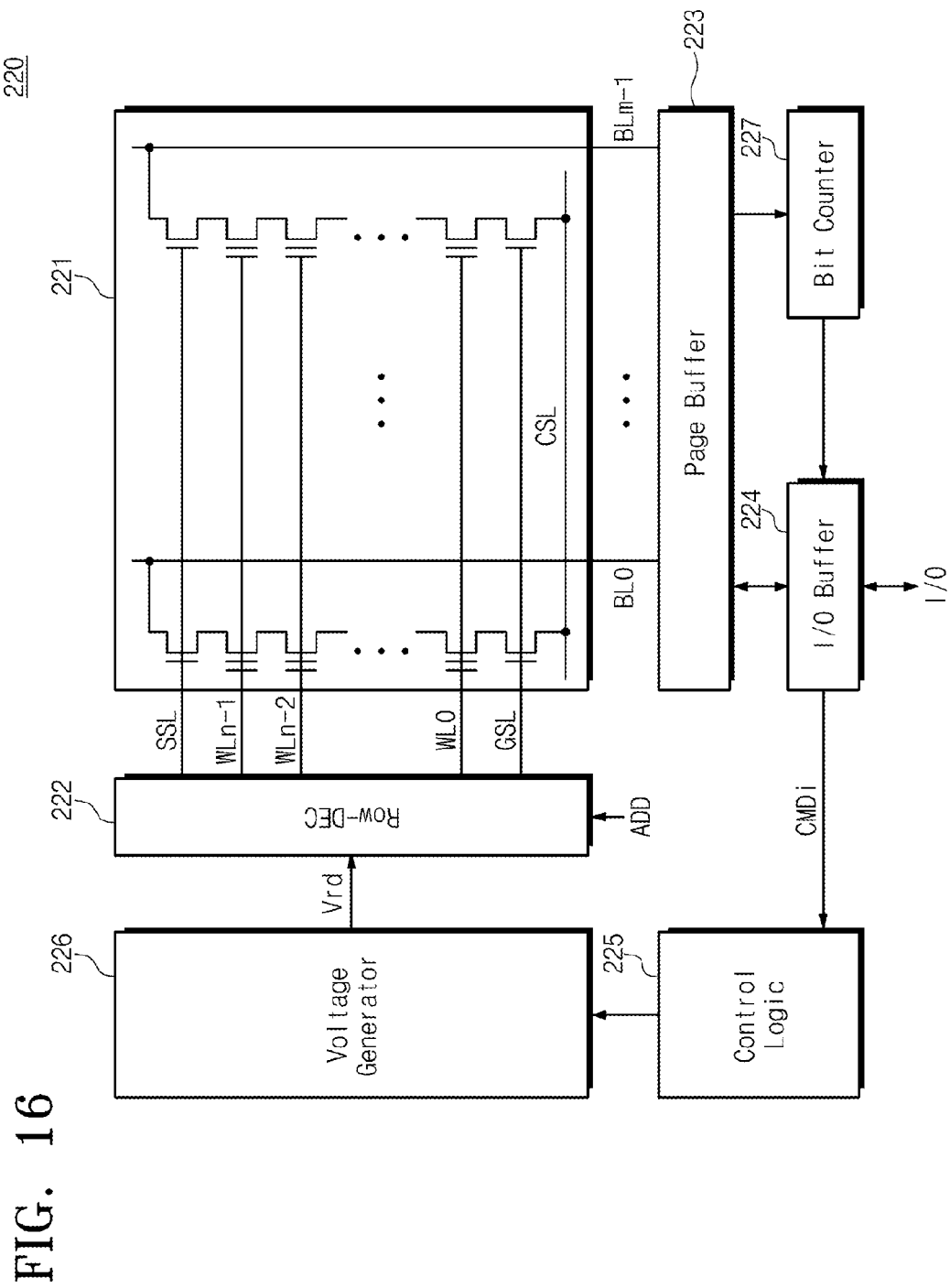
FIG. 16 is a block diagram schematically illustrating a nonvolatile memory device shown in FIG. 15, according to another embodiment of the inventive concept.

FIG. 16 is a block diagram schematically illustrating a nonvolatile memory device shown in FIG. 15, according to another embodiment of the inventive concept. Referring to FIG. 16, nonvolatile memory device 220 includes a memory cell array 221, a row decoder 222, a page buffer 223, an input/output buffer 224, control logic 225, a voltage generator 226, and a bit counter 227. The nonvolatile memory device 220 is substantially the same as that shown in FIG. 4 except for the bit counter 227. Description of components similar to the components in FIG. 4 is omitted from the following.

The nonvolatile memory device 220 performs an MLC read operation of selected memory cells. During the MLC read operation, the page buffer 223 may back up SLC data S_Data in a specific latch or may retain the SLC data S_Data. Data stored in data latches via the MLC read operation may be merged via cooking, and the merged data may be output to an external device via the input/output buffer 224.

If a bit count Yi is requested by the memory controller 210, the backed-up SLC data S_Data is provided to the bit counter 227. The bit counter 227 counts the number of logical 1s or 0s included in the provided SLC data S_Data and outputs a counted value as the bit count Yi. The input/output buffer 224 may output the bit count Yi to the memory controller 210 as a binary value.

Figure 17:
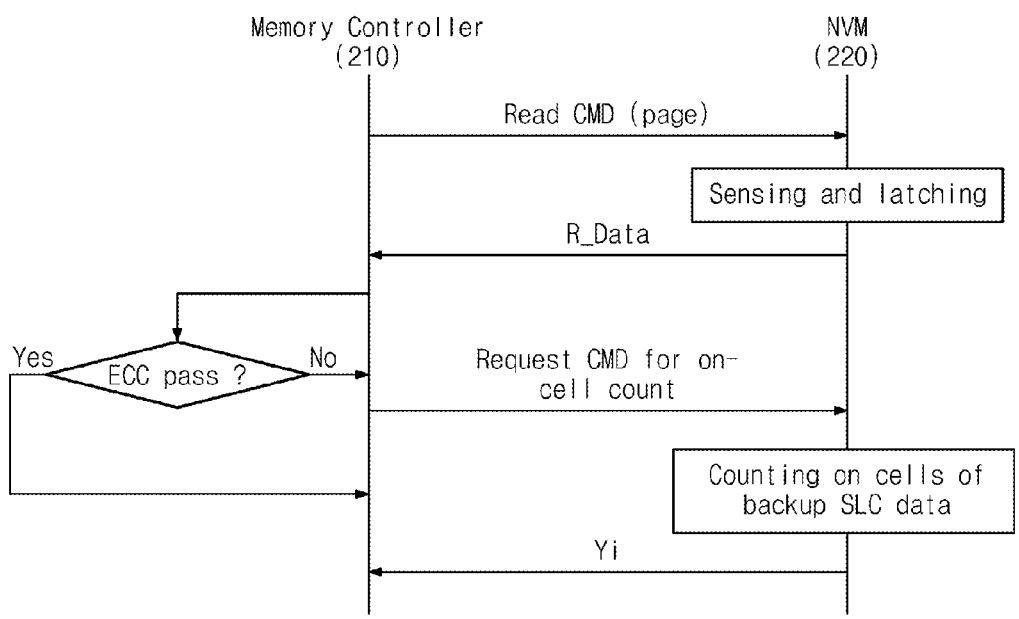
FIG. 17 is a diagram schematically illustrating an operation of a storage device according to another embodiment of the inventive concept.

FIG. 17 is a diagram schematically illustrating an operation of a storage device according to another embodiment of the inventive concept. FIG. 17 schematically shows interaction between memory controller 210 and nonvolatile memory device 220 shown in FIG. 15.

First, the memory controller 210 issues a read command R_CMD to the nonvolatile memory device 220. Herein, the read command R_CMD corresponds to one of a plurality of page data stored in selected memory cells. That is, the read command R_CMD may include read-mode (MLC-mode) information.

The nonvolatile memory device 220 performs a read operation of selected memory cells in response to the read command R_CMD. That is, the nonvolatile memory device 220 performs an MLC read operation of the selected memory cells. Herein, the nonvolatile memory device 220 may perform an SLC read operation of the selected memory cells, and resultant data of the SLC read operation may be backed up. The nonvolatile memory device 220 may perform cooking of data which is latched according to SLC read operations performed at least twice, to merge data into a page. The merged data may be transferred to the memory controller 210 as read data R_Data.

The memory controller 210 may perform an error detection and correction of the read data R_Data. If an error is not detected or is correctable, a read operation of the selected memory cells may end (Yes). In contrast, if the read data R_Data is uncorrectable (No), the memory controller 210 requests an on-cell count (or an off-cell count) from the nonvolatile memory device 120.

The nonvolatile memory device 220 counts the number of logical 1s included in SLC data S_Data previously backed up in a latch without sensing memory cells. The nonvolatile memory device 220 provides the nonvolatile memory device 210 with information Yi indicating the number of logical 1s.

Accordingly, the nonvolatile memory device 220 backs up SLC data S_Data sensed via a read operation in a page buffer 123 or a separate latch during a normal read operation. The nonvolatile memory device 220 counts the number of logical 1s included in the backed-up SLC data S_Data and outputs a counted value to the memory controller 210. The memory controller 210 estimates a shift degree of a distribution valley corresponding to an on-cell count. At this time, the memory controller 210 may employ a distribution valley detection table 215. Interaction between the memory controller 110 and the nonvolatile memory device 120 may enable data read speed to be improved.

Figure 18:
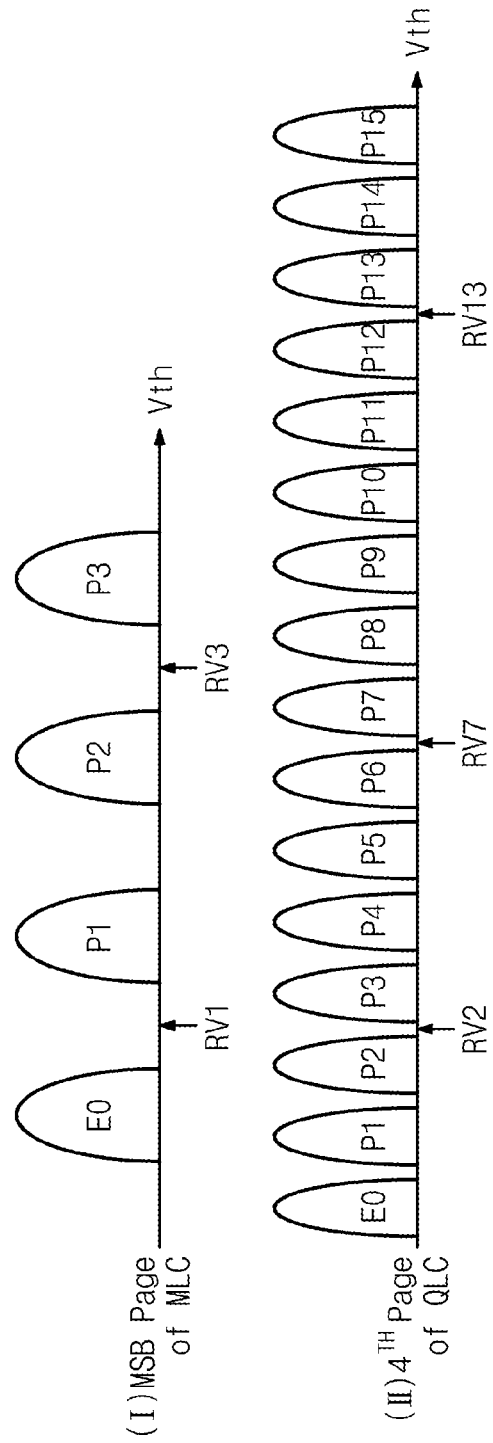
FIG. 18 is a diagram schematically illustrating threshold voltage distributions of various multi-level cells to which the advantage of the inventive concept is applied.

FIG. 18 is a diagram schematically illustrating threshold voltage distributions of various multi-level cells to which embodiments of the inventive concept may be applied. An upper portion (I) of FIG. 18 shows threshold voltage distributions of 2-bit MLCs, and a lower portion (II) thereof shows threshold voltage distributions of 4-bit MLCs.

In the upper portion (I), read voltages RV1 and RV3 are read voltages used to read an MSB page from 2-bit MLCs.

In the lower portion (II), read voltages RV2, RV7, and RV13 are read voltages used to read an MSB page from 4-bit MLCs. The read voltages may be read voltages for an MLC read operation. In a nonvolatile memory device of embodiments of the inventive concept, a plurality of SLC data that are generated during an MLC read procedure may be backed up in a separate latch or in data latches of a page buffer.

A response to a memory controller requesting SLC data to detect a distribution valley, the nonvolatile memory device outputs the backed-up SLC data S_Data without a separate sensing operation.

Figure 19:
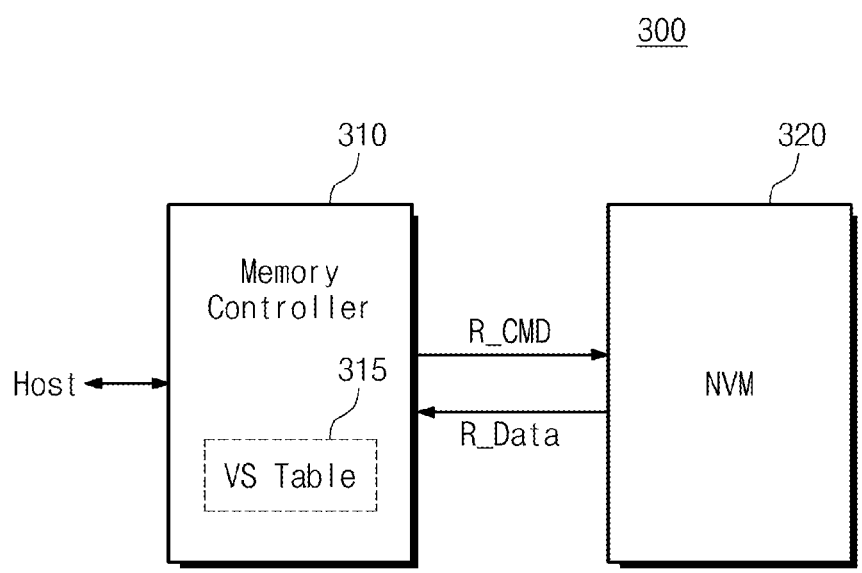
FIG. 19 is a block diagram schematically illustrating a storage device according to still another embodiment of the inventive concept.

FIG. 19 is a block diagram schematically illustrating a storage device according to still another embodiment of the inventive concept. Referring to FIG. 19, a storage device 300 includes a memory controller 310 and a nonvolatile memory device 320. During a read operation, the memory controller 310 is configured to optimize a read voltage of a selected area, based on read data without additionally sensing the selected area (or selected memory cells).

The memory controller 310 may control the nonvolatile memory device 320 in response to a host request. Upon receiving a read request from the host, the memory controller 310 may control the nonvolatile memory device 320 so as to sense and output data at a corresponding location. That is, the memory controller 310 may issue a read command R_CMD of selected memory cells.

The memory controller uses data, read from a selected memory area in response to the read command, to detect a distribution valley. That is, in response to the read command R_CMD, the nonvolatile memory device 320 may sense the selected cell area, latch the sensed data, and output the latched data as the read data R_Data. The nonvolatile memory device 320 does not back up resultant data of at least one SLC read operation of a procedure of reading the read data R_Data in a specific latch.

The memory controller 310 may perform an error detection and correction of the read data R_Data. If the read data R_Data is uncorrectable, the memory controller 310 may estimate a shift degree of a distribution valley, based on the number of logical 1s or logical 0s included in the read data R_Data. That is, the memory controller 310 does not access the nonvolatile memory device 320 to obtain SLC data S_Data for detection of a distribution valley. That is, to decide a location of a distribution valley, the memory controller 310 detects only a difference between logical 1s and logical 0s included in the read data R_Data, a ratio of logical 1s to logical 0s in the read data R_Data, or whether or not the number of logical 1s or logical 0s in the read data R_Data is more than a reference value.

The memory controller 310 may search mapping information in a distribution valley detection table 315 using the number of logical 1s or logical 0s included in the read data R_Data. A shift degree of a distribution valley may be decided by detecting a variation in a relative ratio of logical 1s and logical 0s that are uniformly distributed in read data R_Data, or by detecting an absolute variation in the number of logical 1s or logical 0s. Herein, the distribution valley detection table 315 may be configured according to a variety of references.

Herein, the distribution valley detection table 315 is used to estimate a shift degree of a distribution valley according to various references. For example, the distribution valley detection table 315 may map a shift degree $\Delta V$ of a distribution valley onto a difference between the number of logical 1s of the read data R_Data and the number of logical 0s thereof. Or, the distribution valley detection table 315 may map a shift degree $\Delta V$ of a distribution valley onto a difference between the number of logical 1s of the read data R_Data and a reference value. As another example, the distribution valley detection table 315 may map a shift degree ΔV of a distribution valley onto a relative ratio of logical 1s and logical 0s included in the read data R_Data. Alternatively, the distribution valley detection table 315 may map a shift degree ΔV of a distribution valley onto a difference between the number of logical 1s of the read data R_Data and a reference value.

In addition, when the distribution valley detection table 315 is configured, a reference value of the number of logical 1s or logical 0s of the read data R_Data or a reference value of a ratio of logical 1s to logical 0s is used differently according to deterioration (or wear leveling) of memory cells, a location of blocks, a location of word lines, or program modes (a number of bits stored per memory cell, e.g., SLC, MLC, TLC, and QLC). Alternatively, when the distribution valley detection table 315 is configured, a read voltage offset corresponding to a shift degree ΔV of a distribution valley is mapped differently according to deterioration (or wear leveling) of memory cells, a location of blocks, a location of word lines, or program modes (a number of bits stored per memory cell, e.g., SLC, MLC, TLC, and QLC).

The nonvolatile memory device 320 may contain one or more memory devices. In response to a read command R_CMD from the memory controller 310, the nonvolatile memory device 320 may sense selected memory cells, perform cooking of the sensed data, and output the cooking result as read data R_Data. In particular, the nonvolatile memory device 320 does not back up SLC data in a page buffer or a specific latch during a normal read operation.

According to embodiments of the inventive concept, when an uncorrectable error is detected, the storage device 300 estimates a shift degree of a distribution valley or a retention degree without accessing the nonvolatile memory device 320. That is, a shift degree of a distribution valley is calculated according to the number of logical 1s or logical 0s included in erroneous read data, or a ratio of logical 1s to logical 0s in erroneous read data. Thus, the storage device 300 provides a high-speed read operation even though data read from the nonvolatile memory device 320 is uncorrectable.

Figure 20:
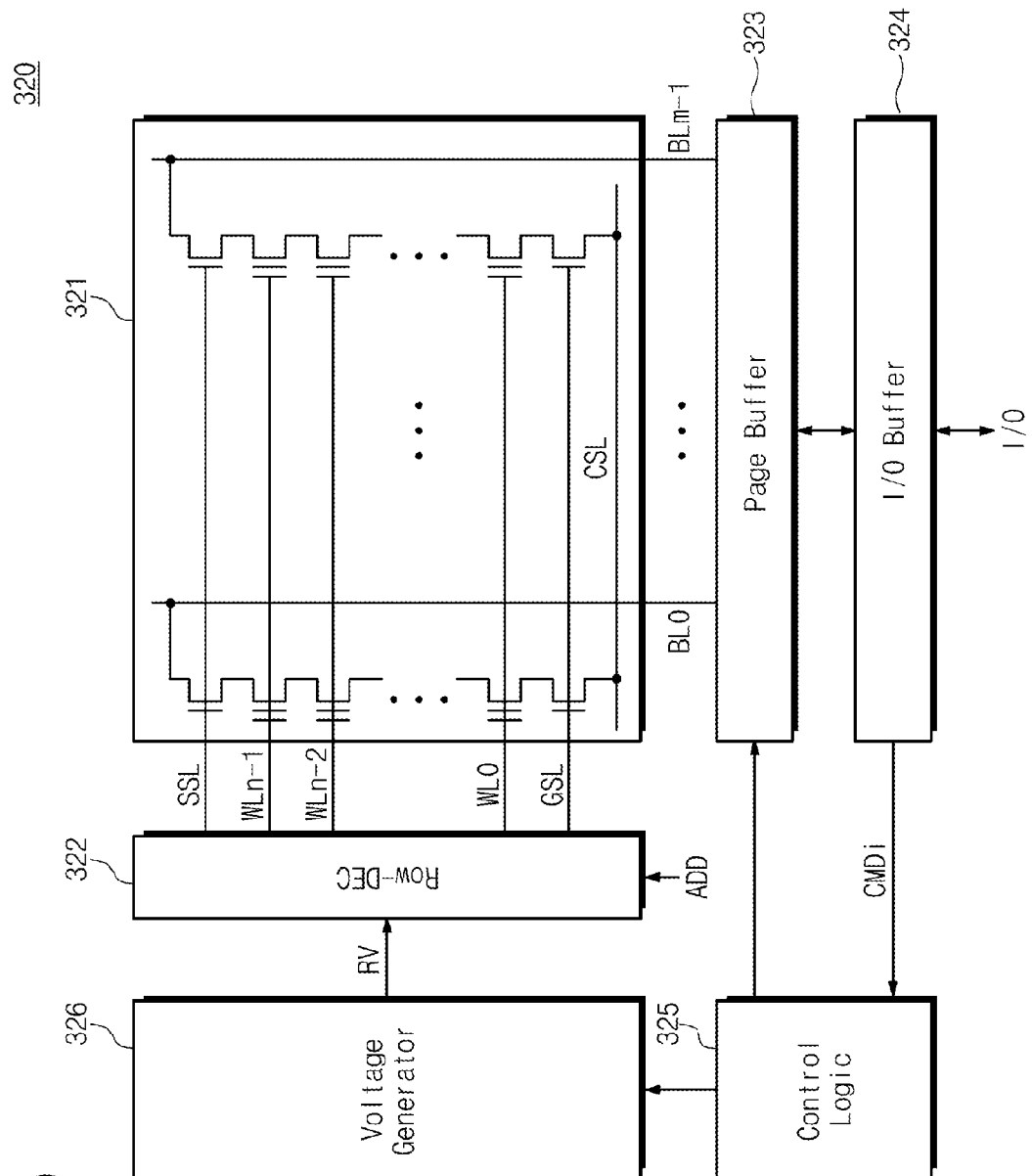
FIG. 20 is a block diagram schematically illustrating a nonvolatile memory device shown in FIG. 19.

FIG. 20 is a block diagram schematically illustrating a nonvolatile memory device shown in FIG. 19. Referring to FIG. 20, nonvolatile memory device 320 includes a cell array 321, a row decoder 322, a page buffer 323, an input/output buffer 324, control logic 325, and a voltage generator 326. Configuration and function of the components 321 to 326 shown in FIG. 20 are substantially the same as those shown in FIG. 4, and description thereof is thus omitted.

The nonvolatile memory device 320 shown in FIGS. 19 and 20 is different from nonvolatile memory device 120 shown in FIG. 4 in that the nonvolatile memory device 320 does not back up SLC data S_Data (or does not retain SLC data S_Data in a latch), because the data used by memory controller 310 to detect a distribution valley is data cooked in the page buffer 323 after an SLC read operation is performed at least twice.

Figure 21:
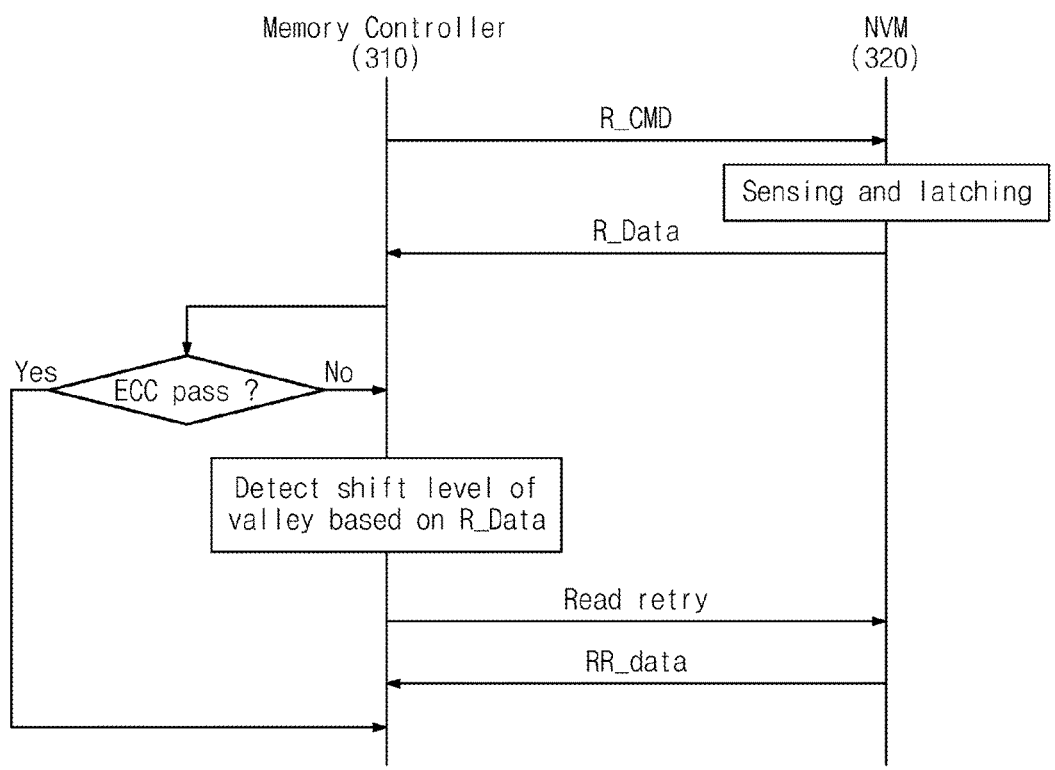
FIG. 21 is a diagram schematically illustrating an operation of a storage device according to another embodiment of the inventive concept.

FIG. 21 is a diagram schematically illustrating an operation of a storage device according to another embodiment of the inventive concept. FIG. 21 schematically shows interaction between memory controller 310 and nonvolatile memory device 320.

First, the memory controller 310 issues a read command R_CMD to the nonvolatile memory device 320. Herein, the read command R_CMD corresponds to one of a plurality of page data stored in selected memory cells. That is, the read command R_CMD may include read-mode (MLC-mode) information.

The nonvolatile memory device 320 performs a read operation of selected memory cells in response to the read command R_CMD. That is, the nonvolatile memory device 320 performs an MLC read operation of the selected memory cells. Herein, the nonvolatile memory device 320 may use a plurality of read voltages to sense MLC data of the selected memory cells. Results of sensing operations performed using the plurality of read voltages is stored in data latches of the page buffer 323 and then output to an external device. Herein, it is unnecessary to back up SLC data sensed using one of the plurality of read voltages in latches. That is, the nonvolatile memory device 320 performs cooking of sensed and latched data to configure a page of data and outputs the cooking result as read data R_Data.

The memory controller 310 may perform an error detection and correction of the read data R_Data. If an error is not detected or is correctable, a read operation of the selected memory cells may end (Yes). In contrast, if the read data R_Data is uncorrectable (No), the memory controller 310 decides a shift degree of a distribution valley only using the read data R_Data. That is, the memory controller 310 decides a shift degree of a distribution valley based on an increment or decrement of logical 1 or logical 0 of the uncorrectable read data R_Data, or based on a relative ratio of logical 1s to logical 0s of the uncorrectable read data R_Data.

In the case that data is processed according to normal randomization, the number of logical 1s included in the read data R_Data is equal or similar to that of logical 0s included therein. Also, a ratio of logical 1s or logical 0s to all bits of the read data R_Data is ideally 1/2. However, this balance is broken (or no longer exists) when a distribution valley shifts due to the drooping and spreading of threshold voltage distributions. The memory controller 310 selects a read voltage using a distribution valley detection table 315 that is configured to map a shift degree ΔV of a distribution valley onto the number of logical 1s or logical 0s or an increment or decrement of a ratio.

The memory controller 310 then issues a read retry request to the nonvolatile memory device 320, and the nonvolatile memory device 320 reads selected memory cells with a selected read voltage in response to the read retry request. The nonvolatile memory device 320 provides the memory controller 310 with read-retry data RR_Data that is sensed using an adjusted read voltage.

In accordance with embodiments of the inventive concept, by using the storage device 300 as described, it is unnecessary to access the nonvolatile memory device 320 to additionally detect a distribution valley. Since a distribution valley may be detected using erroneous read data R_Data, it is possible to quickly adjust a read voltage. Thus, even though the read data R_Data is erroneous, the nonvolatile memory device 320 is not accessed to detect a distribution valley, thereby making it possible to maintain high read performance.

FIG. 22 is a table schematically illustrating distribution valley detection table 315 shown in FIG. 19, according to an embodiment of the inventive concept. Referring to FIG. 22, distribution valley detection table 315 shows a relation between an increment or decrement of logical 1 and a shift degree of a distribution valley.

A memory controller 310 performs an error detection and correction of read data R_Data. When the read data R_Data is uncorrectable, the memory controller 310 detects an increment or decrement of logical 1 or logical 0 included in the read data R_Data. For the sake of easy understanding, the number of logical 1s is illustrated in FIG. 22.

The memory controller 310 detects an increment or decrement of logical 1 from the read data R_Data. For example, in the case that the number of logical 1s is increased to be greater than a reference value by as many as 1 to 5, the memory controller 310 determines a location of a distribution valley as being increased by $\alpha$. Thus, the memory controller 310 increases a read voltage by $\alpha$ according to mapping of a distribution valley detection table 315. Herein, a read voltage RV is described, but a plurality of read voltages may be adjusted using an offset according to $\alpha$ or a location of a threshold voltage distribution.

If the number of logical 1s is decreased to be less than the reference value by as many as 1 to 4, the memory controller 310 determines a location of a distribution valley as being not changed. Thus, the memory controller 320 does not adjust a read voltage.

In the case that the number of logical 1s is decreased to be less than the reference value by as many as 5 to 9, the memory controller 310 determines a location of a distribution valley as being decreased by $\alpha$. Thus, the memory controller 310 decreases a read voltage by $\alpha$ according to mapping of a distribution valley detection table 315.

In the case that the number of logical 1s is decreased to be less than the reference value by as many as 10 to 19, the memory controller 310 determines a location of a distribution valley as being decreased by $\beta$. Thus, the memory controller 310 decreases a read voltage by $\beta$ according to mapping of a distribution valley detection table 315.

When the number of logical 1s is decreased to be less than the reference value by as many as 20 to 29, the memory controller 310 determines a location of a distribution valley as being decreased by $\gamma$. Thus, the memory controller 310 decreases a read voltage by $\gamma$ according to mapping of a distribution valley detection table 315.

In embodiments of the inventive concept, the memory controller 310 determines a shift degree of a distribution valley using the distribution valley detection table 315 where an increment or decrement of logical 1 is mapped onto a shift degree of a distribution valley. However, the inventive concept is not limited thereto.

For example, FIG. 23 is a table schematically illustrating a distribution valley detection table 315 shown in FIG. 19, according to another embodiment of the inventive concept. Referring to FIG. 23, a distribution valley detection table 315 shows a mapping relation between a ratio of logical 0s to all bits of read data R_Data and a shift degree of a distribution valley.

A memory controller 310 detects a ratio RZ of logical 0s from read data R_Data. A ratio RZ of logical 0s of the read data R_Data that is greater than 11/20 and smaller than 12/20 represents that a location of a distribution valley has increased by as much as $\beta$. In this case, the memory controller 310 increases a read voltage by $\beta$, based on mapping of the distribution valley detection table 315.

In the case that the ratio RZ of logical 0s of the read data R_Data is greater than 10/20 and smaller than 11/20, it is considered that a location of a distribution valley has increased by as much as $\alpha$. In this case, based on mapping of the distribution valley detection table 315, the memory controller 310 increases a read voltage by $\alpha$.

In the case that the ratio RZ of logical 0s of the read data R_Data is greater than 9/20 and smaller than 10/20, it is considered that a location of a distribution valley has not changed. In this case, the memory controller 310 does not adjust a read voltage.

In the case that the ratio RZ of logical 0s of the read data R_Data is greater than 8/20 and smaller than 9/20, it is considered that a location of a distribution valley has decreased by as much as $\alpha$. In this case, based on mapping of the distribution valley detection table 315, the memory controller 310 decreases a read voltage by $\alpha$.

In case that the ratio RZ of logical 0s of the read data R_Data is greater than 7/20 and smaller than 8/20, it is considered that a location of a distribution valley has decreased by as much as $\beta$. In this case, based on mapping of the distribution valley detection table 315, the memory controller 310 decreases a read voltage by $\beta$.

In case that the ratio RZ of logical 0s of the read data R_Data is smaller than 5/20, it is considered that a location of a distribution valley has decreased by as much as $\omega$. In this case, based on mapping of the distribution valley detection table 315, the memory controller 310 decreases a read voltage by $\omega$.

Using the distribution valley detection table 315, the memory controller 310 may estimate a shift degree of a distribution valley due to a variation in a ratio of logical 1s or logical 0s.

Figure 24:
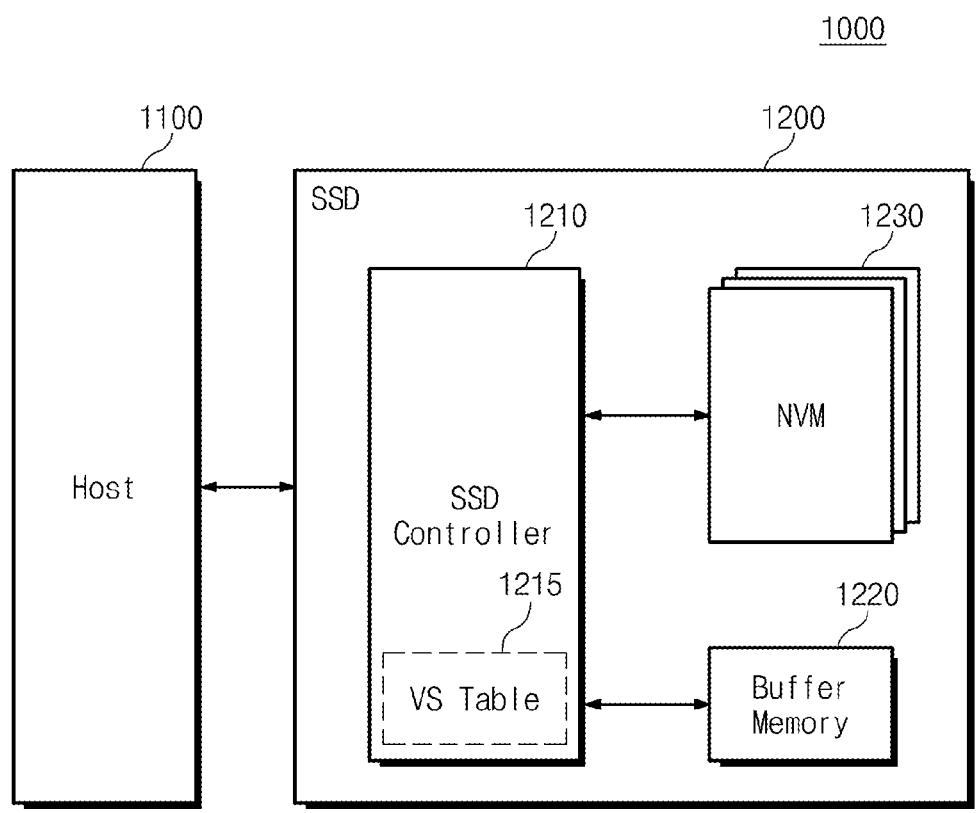
FIG. 24 is a block diagram illustrating a user device including a solid state drive according to an embodiment of the inventive concept.

FIG. 24 is a block diagram illustrating a user device including a solid state drive according to an embodiment of the inventive concept. Referring to FIG. 24, a user device 1000 includes a host 1100 and a solid state drive (hereinafter, referred to as SSD) 1200. The SSD 1200 includes an SSD controller 1210, a buffer memory 1220, and a nonvolatile memory device 1230.

The SSD controller 1210 provides physical interconnection between the host 1100 and the SSD 1200. The SSD controller 1210 provides an interface with the SSD 1200 corresponding to a bus format of the host 1100. In particular, the SSD controller 1210 includes a distribution valley detection table 1215. If data read from the nonvolatile memory device 1230 is uncorrectable, the SSD controller 1210 estimates a shift of a distribution valley without additionally accessing the nonvolatile memory device 1230 and adjusts a read voltage based on the estimated result. Alternatively, the nonvolatile memory device 1230 may have a function of backing up SLC data during a normal MLC read operation. Thus, even though read data is uncorrectable, a shift degree of a distribution valley may be calculated without accessing memory cells of the nonvolatile memory device 1230.

The bus format of the host 1100 may be any of USB (Universal Serial Bus), SCSI (Small Computer System Interface), PCI express, ATA, PATA (Parallel ATA), SATA (Serial ATA), SAS (Serial Attached SCSI), and the like.

The buffer memory 1220 temporarily stores write data provided from the host 1100 or data read out from the nonvolatile memory device 1230. In the event that data existing in the nonvolatile memory device 1230 is cached responsive to a read request of the host 1100, the buffer memory 1220 supports a cache function of providing cached data directly to the host 1100. Typically, a data transfer speed of a bus format (e.g., SATA or SAS) of the host 1100 may be higher than that of a memory channel of the SSD 1200. That is, in the event that an interface speed of the host 1100 is markedly fast, lowering of the performance due to a speed difference may be minimized by providing the buffer memory 1220 having a large storage capacity.

The buffer memory 1220 may be implemented with a synchronous DRAM to provide sufficient buffering to the SSD 1200 used as an auxiliary mass storage device. However, the inventive concept is not limited thereto.

The nonvolatile memory device 1230 is provided as storage medium of the SSD 1200. For example, the nonvolatile memory device 1230 may be a NAND flash memory device having a mass storage capacity. The nonvolatile memory device 1230 may be formed of a plurality of memory devices. In this case, memory devices may be connected with the SSD controller 1210 by different channels. In embodiments of the inventive concept, the nonvolatile memory device 1230 used as storage medium is formed of a NAND flash memory. However, the nonvolatile memory device 1230 is not limited to a NAND flash memory device. For example, in other embodiments of the inventive concept the nonvolatile memory device 1230 used as the storage medium of the SSD 1200 may be formed by Phase-change RAM (PRAM), Magnetic RAM (MRAM), Resistive RAM (ReRAM), Ferroelectric RAM (FRAM), NOR flash memory, and so on. Further, the inventive concept may be applied to a memory system which uses different types of memory devices together. The nonvolatile memory device 1230 may be substantially the same as that described with reference to FIG. 1.

Figure 25:
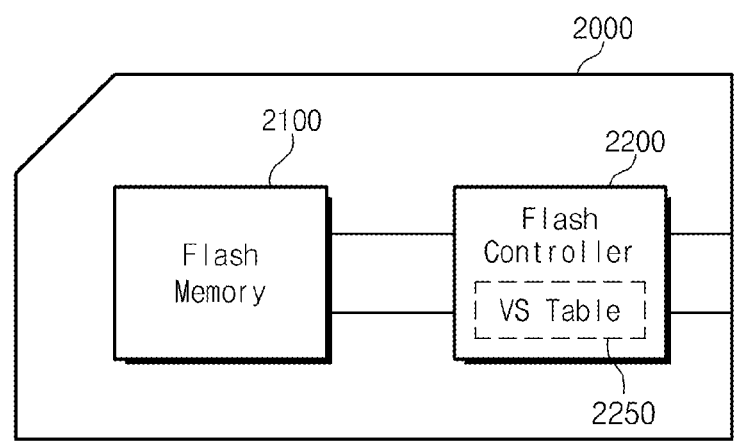
FIG. 25 is a block diagram schematically illustrating a memory card according to another embodiment of the inventive concept.

FIG. 25 is a block diagram schematically illustrating a memory card 2000 according to another embodiment of the inventive concept. Referring to FIG. 25, a memory card 2000 includes a flash memory 2100 and a flash controller 2200. The flash controller 2200 controls the flash memory 2100 in response to control signals that are received from the outside of the memory card 2000.

In the memory card 2000, the flash memory 2100 may operate substantially the same as at least one of nonvolatile memory devices shown in FIGS. 4, 16, and 20. That is, the flash memory 2100 reads selected memory cells with difference read voltages and provides a read result to the flash controller 2200.

The flash controller 2200 includes a distribution valley detection table 2250. If data read from the flash memory 2100 is uncorrectable, the flash controller 2200 estimates a shift of a distribution valley without additionally accessing the flash memory 2100 and adjusts a read voltage based on the estimated result. Alternatively, the flash memory 2100 may have a function of backing up SLC data during normal MLC read operation. Thus, even though read data is uncorrectable, a shift degree of a distribution valley may be calculated without accessing memory cells of the flash memory 2100.

The memory card 2000 of the inventive concept may be formed of a memory card device, an SSD device, a multimedia card device, an SD card, a memory stick device, a hard disk drive device, a hybrid drive device, or a general-purpose serial bus flash device. For example, the memory card 2000 of the inventive concept may be a card that satisfies the industrial standard for user devices, such as a digital camera, a computer, and so on.

Figure 26:
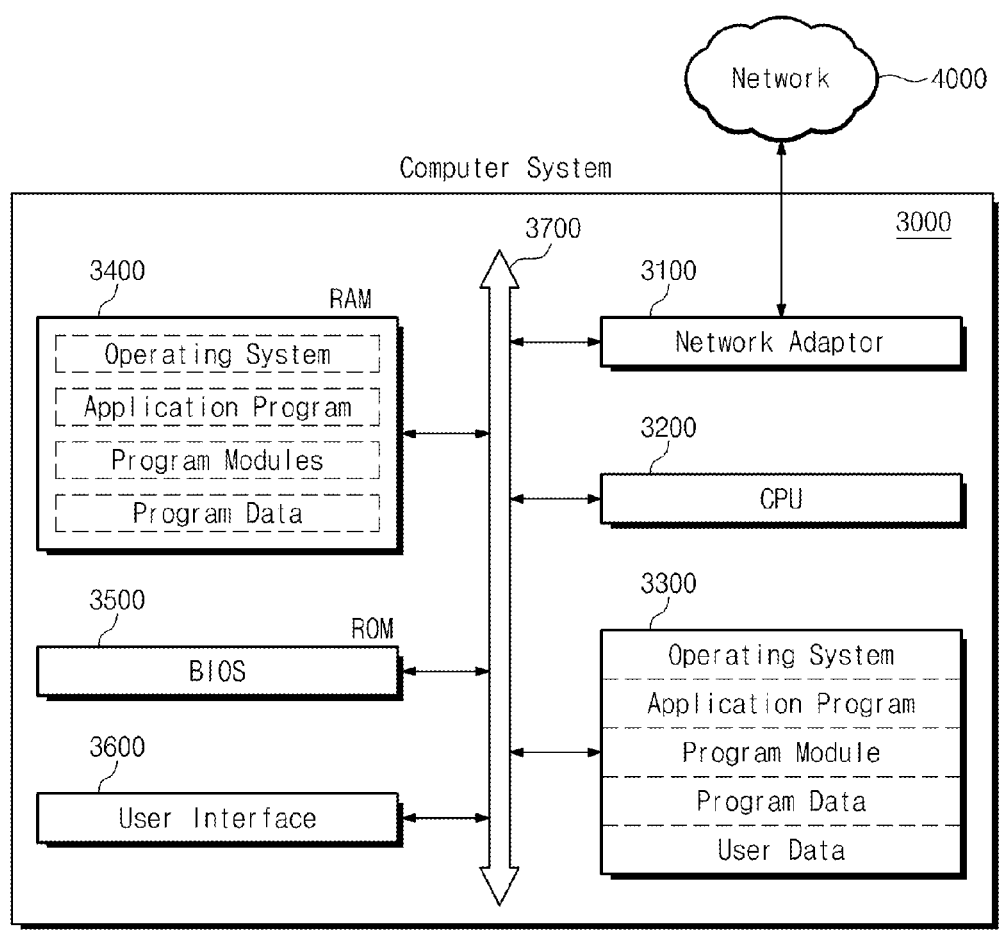
FIG. 26 is a block diagram schematically illustrating a computing system according to an embodiment of the inventive concept.

FIG. 26 is a block diagram schematically illustrating a computing system according to an embodiment of the inventive concept. Referring to FIG. 26, a computing system 3000 includes a network adaptor 3100, a central processing unit (CPU) 3200, a mass storage device 3300, a RAM 3400, a ROM 3500, and a user interface 3600 which are connected with a system bus 3700.

The network adaptor 3100 provides an interface between the computing system 3000 and external networks 4000. The CPU 3200 controls an overall operation for driving an operating system and an application program which are resident on the RAM 3400. The data storage device 3300 may store data needed for the computing system 3000. For example, the data storage device 3300 may store an operating system for driving the computing system 3000, an application program, various program modules, program data, user data, and so on.

The RAM 3400 may be used as a working memory of the computing system 3000. Upon booting, the operating system, the application program, the various program modules, and program data needed to drive programs and various program modules read out from the data storage device 3300 may be loaded onto the RAM 3400. The ROM 3500 may store a basic input/output system (BIOS) which is activated before the operating system is driven upon booting. Information exchange between the computing system 3000 and a user may be made via the user interface 3600.

In example embodiments, the computing system 3000 may further include a battery, a modem, and so on. Although not shown, the computing system 3000 may further include an application chipset, a camera image processor (CIS), a mobile DRAM, and so on.

The mass storage device 3300 may be implemented with a solid state drive, a multimedia card (MMC), a secure digital (SD) card, a micro SD card, a memory stick, an ID card, a PCMCIA (Personal Computer Memory Card International Association) card, a chip card, an USB card, a smart card, a compact flash (CF) card, and so on. The mass storage device 3300 may perform a pseudo program operation according to the size of write-requested data or a state of a buffer area. In the case that an uncorrectable error is detected, the mass storage device 3300 may adjust a read voltage without additionally accessing memory cells.

A semiconductor device according to the inventive concept may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A read method of a storage device, the storage device including a memory controller configured to control reading of data stored in a nonvolatile memory device, the read method comprising:
    sensing data from a selected memory area of the nonvolatile memory device according to a first read voltage;
    latching the sensed data by a page unit;
    combining the latched data by the page unit;
    outputting the combined data as read data corresponding to the page unit;
    backing up or retaining a page of the latched data;
    detecting an error in the read data at the memory controller;

correcting the detected error in the read data at the memory controller when the error is correctable;
the memory controller receiving the page of backed-up or retained data when the read data is uncorrectable and deciding a second read voltage for reading the data from the selected memory area by comparing a number of logical 0s or a number of logic 1s included in the page of backed-up or retained data with a reference value, or by comparing a ratio of the number of logical 1s and the number of logical 0s in the page of backed-up or retained data to the reference value; and
reading the data from the selected area of the nonvolatile memory device according to the second read voltage,
wherein said deciding the second read voltage comprises searching a distribution valley detection table to decide an increment or decrement of the first read voltage according to the number of low data states or the number of high data states, or according to the ratio, wherein the distribution valley detection table maps: (1) at least one of a plurality of values for the number of low data states, a plurality of values for the number of high data states, and a plurality of values of the ratio, to (2) changes to be applied to the first read voltage in order to produce the second read voltage.

2. The read method of claim 1, wherein the data stored in the selected memory area is encoded to have a specific ratio of low data states and high data states through a randomization operation.

3. The read method of claim 1, wherein the increment or decrement of the first read voltage varies according to a characteristic of the selected memory area.

4. The read method of claim 3, wherein the characteristic of the selected memory area includes at least one of a number of bits stored per memory cell in the selected memory area, a location of a block, or a location of a word line.

5. The read method of claim 1, wherein the increment or decrement of the first read voltage is variable according to locations of a plurality of threshold voltage distributions of the read data.

6. The read method of claim 1, wherein the selected memory area comprises charge trap flash memory cells which store the data.

7. A storage device, comprising:
a nonvolatile memory device configured to read data from selected memory cells using a first read voltage in response to a read command, latch the sensed data by a page unit, combine the latched data by the page unit, output the combined data as read data corresponding to the page unit, and back up or retain a page of the latched data; and
a memory controller configured to receive the page of backed-up or retained data when the read data is uncorrectable, and to decide a second read voltage for reading the data from the selected memory cells when an error in the read data is uncorrectable, the second read voltage being decided without an additional data read operation, by comparing a number of logical 0s or a number of logical 1s in the page of backed-up or retained read data with a reference value, or by comparing a ratio of the number of logical 0s and the number of logical 1s in the page of backed-up or retained read data to the reference value,
wherein the nonvolatile memory device is further configured to read the data from the selected memory cells using the second read voltage.

8. The storage device of claim 7, wherein said memory controller includes a distribution valley detection table to decide an increment or decrement of the first read voltage according to the number of logical 0s or the number of logical 1s, or according to the ratio, wherein the distribution valley detection table maps: (1) at least one of a plurality of values for the number of logical 0s, a plurality of values for the number of logical 1s, and a plurality of values of the ratio, to (2) changes to be applied to the first read voltage in order to produce the second read voltage, and wherein the adjustment values are decided differently according to an address of the selected memory cells, wear leveling of the selected memory cells, a number of bits stored per memory cell of the selected memory cells, or a time that elapses from a program time of the selected memory cells.

9. The storage device of claim 8, wherein the increment or decrement of the first read voltage is variable according to locations of a plurality of threshold voltage distributions of the read data.

10. The storage device of claim 7, wherein the data stored in the selected memory cells is encoded to have a specific ratio of logical 1s to logical 0s through randomization.

11. A storage device, comprising:
a nonvolatile memory device configured to sense data in a selected memory area of the nonvolatile memory device using at least one or more read voltages, latch the sensed data by page unit, combine the latched data by page unit, output the combined data as read data corresponding to a page unit, and back up or retain a page of the latched data; and
a memory controller configured to receive the page of backed-up or retained data when the read data is uncorrectable, and to decide a second read voltage for reading the data in the selected memory area by comparing a number of logical 0s or a number of logic 1s included in the page of backed-up or retained data with a reference value, or by comparing a ratio of the number of logical 1s and the number of logical 0s in the page of backed-up or retained data to the reference value,
wherein the nonvolatile memory device is further configured to read the data in the selected memory area using the second read voltage,
wherein said memory controller includes a distribution valley detection table to decide an increment or decrement of the first read voltage according to the number of logical 0s or the number of logical 1s, or according to the ratio, wherein the distribution valley detection table maps: (1) at least one of a plurality of values for the number of logical 0s, a plurality of values for the number of logical 1s, and a plurality of values of the ratio, to (2) changes to be applied to the first read voltage in order to produce the second read voltage.

12. The storage device of claim 11, wherein the adjustment values are decided differently according to an address of the selected memory area, wear leveling in the selected memory area, a number of bits stored per memory cell in the selected memory area, or a time that elapses from a program time of the selected memory area.

13. The storage device of claim 11, wherein the nonvolatile memory device comprises:
a cell array including a plurality of charge trap flash memory cells;
a page buffer connected to the cell array via bit lines and configured to sense and latch the data stored in selected memory cells;

a voltage generator configured to provide the at least one or more read voltages or the second read voltage to a word line of the selected memory cells; and control logic configured to control the page buffer and the voltage generator according to a request of the memory controller so as to sense and latch the data stored in the selected memory cells and output the latched data, wherein the page buffer comprises a data latch configured to back up or retain the page of the latched data.

14. The storage device of claim 13, wherein upon receiving a command requesting the page of backed-up or retained data from the memory controller, the nonvolatile memory device is configured to output the page of backed-up or retained data without sensing and latching operations of the data in the selected memory cells.

15. The storage device of claim 13, wherein the nonvolatile memory device further comprises:

a bit counter configured to count the number of logical 0s or the number of 1s included in the page of backed-up or retained data, or the ratio of the number logical 1s the number of logical 0s in the page of backed-up or retained data.

16. The read method of claim 1, wherein the low data state is a logical 1state, and the high data state is a logical 0 state.

* * * * *